US006912684B2

(12) United States Patent
Miyata et al.

(10) Patent No.: US 6,912,684 B2
(45) Date of Patent: Jun. 28, 2005

(54) ERROR CORRECTION ENCODING METHOD AND APPARATUS, AND ERROR CORRECTION DECODING METHOD AND APPARATUS

(75) Inventors: Yoshikuni Miyata, Tokyo (JP); Hachiro Fujita, Tokyo (JP); Takahiko Nakamura, Tokyo (JP); Hideo Yoshida, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 483 days.

(21) Appl. No.: 10/097,347

(22) Filed: Mar. 15, 2002

(65) Prior Publication Data

US 2002/0184595 A1 Dec. 5, 2002

(30) Foreign Application Priority Data

Apr. 4, 2001 (JP) ...................................... 2001-105959

(51) Int. Cl.[7] .............................................. H03M 13/00
(52) U.S. Cl. ......................... 714/776; 714/786; 375/265
(58) Field of Search ................................ 714/701, 751, 714/776, 781, 786, 792, 794, 746, 752; 375/265

(56) References Cited

U.S. PATENT DOCUMENTS

| | | | | |
|---|---|---|---|---|
| 5,446,747 A | * | 8/1995 | Berrou ........................ | 714/788 |
| 5,721,745 A | * | 2/1998 | Hladik et al. ................ | 714/755 |
| 6,028,897 A | * | 2/2000 | Wang ........................... | 375/265 |
| 6,484,285 B1 | * | 11/2002 | Dent ........................... | 714/791 |
| 6,772,391 B1 | * | 8/2004 | Shin ............................ | 714/786 |

FOREIGN PATENT DOCUMENTS

WO 01/84721 11/2001

OTHER PUBLICATIONS

"EURESCOM Review of UMTS Air Interface", EURESCOM Project P921, 1999.*
"IEE Standard 802.11a–1999", Sep. 16, 1999.*
"Increasing Throughput of Iterative Decoder", J. Vogt et al., Electronics Letters, vol. 37 Issue 12, Jun. 7, 2001, pp 770–771.*
Benedetto et al., TDA Progress Report 42–124, Jet Propulsion Laboratory, pp. 63–87 (Feb. 1996).

* cited by examiner

Primary Examiner—Guy J. Lamarre
Assistant Examiner—John P. Trimmings
(74) Attorney, Agent, or Firm—Birch, Stewart, Kolasch & Birch, LLP

(57) ABSTRACT

An error correction encoding method and apparatus, and an error correction decoding method and apparatus are provided without requiring transmission of tail bits. A turbo encoding step (ST41–ST45) and a transmission termination processing step (ST46→ST44–ST47) are included. In the turbo encoding step, a transmission information bit sequence is divided into a plurality of frames. Registers in each recursive systematic convolutional encoder are initialized before turbo encoding of a first frame. After turbo encoding of the first frame is carried out, a second frame and following frames are continuously subjected to turbo encoding without initializing the registers in each recursive systematic convolutional encoder before the turbo encoding of the second frame and following frames. In a transmission termination processing step, tail bits for initializing the registers in each recursive systematic convolutional encoder are calculated only after a final frame has been subjected to turbo encoding.

12 Claims, 14 Drawing Sheets

RELATED ART

RELATED ART

RELATED ART

RELATED ART

ERROR CORRECTION ENCODING METHOD AND APPARATUS, AND ERROR CORRECTION DECODING METHOD AND APPARATUS

This application is based on Application No. 2001-105959, filed in Japan on Apr. 4, 2001, the contents of which are hereby incorporated by reference.

BACKGROUND OF THE INVENTION

1. Field of the Invention

The present invention relates to an error correction encoding method and apparatus, and an error correction decoding method and apparatus. More particularly, it relates to a method and apparatus for encoding turbo codes as well as a method and apparatus for decoding turbo codes.

2. Description of the Related Art

A known turbo encoding method will be described below. FIG. 10 is a flow chart illustrating the known turbo encoding method using a turbo encoder which will be described later. In FIG. 10, ST71 designates a processing step for determining the block length N of an interleaver at the start of transmission. ST72 designates a processing step for preparing an interleaver pattern of the block length N. ST73 designates a processing step for initializing the value of each register 65 of a first convolutional encoder and the value of each register 66 of a second convolutional encoder. ST74 designates a processing step for buffering an information bit sequence u for one block. ST75 designates a processing step for performing turbo encoding with a turbo encoder 61, and outputting parity bit sequences $p_a$ and $p_b$. ST76 designates a processing step for calculating tail bits t used to return the registers 65 and 66 to their initial values. ST77 designates a processing step for determining whether a frame being now processed is the last (final) one, and switching the processing operation.

FIG. 11 illustrates the configuration of the turbo encoder used at the sending side for implementing the above-mentioned turbo encoding method. In FIG. 11, the turbo encoder, generally designated at reference numeral 61, includes a first recursive systematic convolutional encoder 62 (hereinafter, referred to simply as a first convolutional encoder) for convolutionally encoding an information bit sequence u to output a parity bit sequence $p_a$, an interleaver 63, a second recursive systematic convolutional encoder 64 (hereinafter, referred to simply as a second convolutional encoder) for convolutionally encoding the information bit sequence u, which has been permuted by the interleaver 63, thereby to output a parity bit sequence $p_b$, the registers 65 of the first convolutional encoder 62, and the registers 66 of the second convolutional encoder 64.

FIG. 12 is the configuration of the information bit sequence and the parity bit sequences which have been encoded by the known encoding method and each merged into one frame. In FIG. 12, 51 designates the information bit sequence u input to the turbo encoder 61. 52 designates the parity bit sequence $p_a$ output from the first convolutional encoder 62. 53 designates the parity bit sequence $p_b$ output from the second convolutional encoder 64. 54 designates tail bits $t_{a,u}$ for returning the registers in the first convolutional encoder 62 to their initial values. 56 designates tail bits $t_{a,p}$ for returning the registers in the first convolutional encoder 62 to their initial values. 55 designates tail bits $t_{b,u}$ for returning the registers in the second convolutional encoder 64 to their initial values. 57 designates tail bits $t_{b,p}$ for returning the registers in the second convolutional encoder 64 to their initial values.

FIG. 13 illustrates the configuration of an iterative decoder used at the receiving side. In FIG. 13, a first soft-input and soft-output decoder 81 (hereinafter, referred to simply as a first decoder) is input with reception sequences x, $y_a$, $z_{a,u}$, $z_{a,p}$ and priori information (logarithm of priori information ratio) La(u), and calculates log-likelihood ratio L(u) therefrom. A second soft-input and soft-output decoder 82 (hereinafter, referred to simply as a second decoder) is input with reception sequences x, $y_b$, $z_{b,u}$, $z_{b,p}$, and priori information La(u), and calculates log-likelihood ratio L(u). The iterative decoder further includes interleavers 83 and 84, a deinterleaver 85, a first adder 86, a second adder 87, a determiner 88 for calculating an estimate value of a transmitted information bit sequence from the log-likelihood ratio L(u) output from the second decoder 82, and a switch 89 for switching the priori information La(u), which is input to the first decoder 81, to an initial value 0 or a value output from the second adder 87.

FIG. 14 is a flow chart showing an MAP (maximum a posteriori) decoding method, which is one technique of a calculation means of the soft-input and soft-output decoder (i.e., the first decoder 81 and the second decoder 82) used at the receiving side. In FIG. 14, an initial value $\alpha(S_{j,0})$ of a forward path metric $\alpha(S_{j,k})$, k=0, 1, 2, ..., N (k represents a point in time) is set in step ST101. The time point k is initialized to 1 in step ST102. Branch metrics $\gamma_{i,k}$ is calculated in step ST103. A forward path metric $\alpha(S_{j,k})$ is calculated in step ST104. The forward path metric $\alpha(S_{j,k})$ thus calculated is stored in a memory in step ST105. It is determined in step ST106 whether the time point k has become N or more. The time point k is incremented by 1 in step ST107. An initial value $\beta(S_{j,n+T})$ of a backward path metric $\beta(S_{j,k})$, k=1, 2, ..., N+T (k designates time points) is set in step ST108. The time point k is initialized to N+T−1 in step ST109. The branch metric $\gamma_{i,k}$ is calculated in step ST110. The backward path metric $\beta(S_{j,k})$ is calculated in step ST111. Logarithmic likelihood ratio $L(u_k)$ is calculated in step ST112. An extrinsic information $Le(u_k)$ is calculated in step ST113. It is determined in step ST114 whether the time point k has become 1 or less. The time point k is decremented by 1 in step ST115.

Next, the operation of the known encoding method will be described concretely. An information bit sequence u: $u_1$, $u_2$, ..., $u_N$ is successively input to the turbo encoder 61 shown in FIG. 11 in the order of time points 1, 2, ..., N, respectively. That is, the first recursive systematic convolutional encoder 62 of the turbo encoder 61 encodes the information bit sequence u input thereto, and outputs a parity bit sequence $p_a$: $p_{a,1}, p_{a,2}, ..., p_{a,N}$.

In order to return the registers of the first convolutional encoder 62 to their initial values after the last or final information bit $u_N$ is input to the first convolutional encoder 62 at time point N, the tail bits $t_{a,u}$ and the tail bits $t_{a,p}$ are calculated (here, the lengths of tail bits $t_{a,u}$ and $t_{a,p}$ are assumed to be T, respectively.). The tail bits can be uniquely calculated according to the values of the registers after the last information bit $u_N$ has been input. The registers are returned to their initial values when the tail bits $t_{a,u}$ are input to the first convolutional encoder 62. The first convolutional encoder 62 outputs the tail bits $t_{a,p}$ as parity bits.

The second convolutional encoder 64 of the turbo encoder 61 successively encodes sequences of information bits u which have been permuted by the interleaver 63 and input thereto, and outputs the parity bit sequence $p_b$: $p_{b,1}, p_{b,2}, ..., p_{b,N}$.

After the last information bit $u_N$ is input at time point N, the tail bits $t_{b,u}$ and the tail bits $t_{b,p}$ for returning the registers of the second convolutional encoder 64 to their initial values are calculated (the lengths of $t_{b,\ u}$ and $t_{b,\ p}$ are assumed to be T, respectively). The tail bits can be uniquely calculated according to the values of the registers after the last information bit $u_N$ has been input. When the tail bits $t_{b,\ u}$ are input to the second convolutional encoder 64, the registers therein are returned to their initial values, and the second convolutional encoder 64 outputs the tail bits $t_{b,\ p}$ as parity bits.

After the encoding processing as described above has been done, the information bit sequence u, the parity bit sequences $p_a$, $p_b$ and the tail bits $t_{a,\ u}$, $t_{a,\ p}$, $t_{b,\ u}$, $t_{b,\ p}$ are transmitted, as shown in FIG. 12.

In the turbo encoder 61, the information bit sequence u input to the second convolutional encoder 64 is required to be permuted by the interleaver 63. Therefore, it is necessary to divide the information bit sequence u into units of blocks of N in length. The interleaver 63 permutes the information bit sequences $u_1, u_2, \ldots, u_N$ thus divided into the block units, respectively, of N in length. The information bit sequences, the parity bit sequences and the tail bit sequences finally encoded are transmitted in frames, as shown in FIG. 12.

Next, reference will be made to the processing procedure according to the turbo encoding from the start to the end of transmission while referring to FIG. 10. First of all, the block length N in the interleaver 63 is decided in step ST71 as shown in FIG. 10. Then, an interleaver pattern for the block length N is prepared in step ST72. The registers D of the convolutional encoders are initialized in step ST73. After the information bit sequence u to be transmitted has been buffered in step ST74, the turbo encoding processing is carried out to output parity bit sequences $p_a$, $p_b$ in step ST75. Tail bits t are output in step ST76. In step ST77, it is determined whether the transmission frame being now processed is the last one. When the frame being now processed is not the last one, a return is performed to step ST73 where the registers D of the convolutional encoders are initialized, and the turbo encoding is continued. When the frame being now processed is the last one, the transmission processing is terminated.

At the receiving side, there are received a reception sequence x which is the information bit sequence u being transmitted and added with noise on the transmission path or channel, reception sequences $y_a$ and $y_b$ which are the parity bit sequences $p_a$ and $p_b$ being transmitted and added with noise on communication channels, and reception sequences $Z_{a,\ u}$, $z_{a,\ p}$, $z_{b,\ u}$, $z_{b,\ p}$ which are the tail bits being transmitted and added with noise on communication channels. Because the interleaver is used for encoding, decoding of turbo symbols cannot be started until all the reception sequences of 3N+4T in length are received. After the reception has been completed, the reception sequences are input to the iterative decoder where they are subjected to iterative decoding.

Here, concrete reference will be made to the operation of the iterative decoder shown in FIG. 13. At the receiving side, there are received the reception sequences x: $x_1, x_2, \ldots, x_N$ which are the information bit sequence u being transmitted and added with noise on communication channels, a reception sequence $y_a$: $y_{a,\ 1}, y_{a,\ 2}, \ldots, Y_{a,\ N}$ which is the parity bit sequence $p_a$ being transmitted and added with noise on communication channels, the reception sequence $y_b$: $y_{b,\ 1}$, $y_{b,\ 2}, \ldots, y_{b,\ N}$ which is the parity bit sequence $p_b$ being transmitted and added with noise on communication channels, and reception sequences $z_{a,\ u}$, $z_{a,\ p}$, $z_{b,\ u}$, $z_{b,\ p}$ which are the tail bits $t_{a,\ u}$, $t_{a,\ p}$, $t_{b,\ u}$, $t_{b,\ p}$ being transmitted and added with noise on communication channels.

First of all, the reception sequences x, $y_a$, $z_{a,\ u}$ $Z_{a,\ p}$ are input to the first decoder 81. Moreover, the switch 89 is thrown to a side A only at a decoding start time point. An initial value 0 is input as the priori information: $La(u_k)$, k=1, 2, ..., N. The first decoder 81 performs the soft-input and soft-output decoding from these input values to calculate the logarithmic likelihood ratio: $L(u_k)$, k=1, 2, ..., N corresponding to the information bits $u_k$ (here, k designates time points). At this time, the logarithmic likelihood ratio: $L(u_k)$ can be represented by the following expression (1).

$$L(u_k) = Lc \cdot x_k + La(u_k) + Le(u_k) \qquad (1)$$
$$= \ln \frac{Pr(u'_k = 1 \mid \{Y\})}{Pr(u'_k = 0 \mid \{Y\})}$$

where $Le(u_k)$ represents extrinsic information; $La(u_k)$ represents the value which is calculated with one-preceding extrinsic information being taken as the priori information; $Pr(u'_k=1|\{Y\})$ represents a probability that the estimated information bits: $u'_k$ calculated with the whole sequence $\{Y\}$ of the reception signal having been received are 1; $Pr(u'_k=0|\{Y\})$ represents a probability that the estimated information bits: $u'_k$ calculated with the whole sequence $\{Y\}$ of the reception signal having been received are 0. That is, the probability of the estimated information bits $u'_k$ being 1 with respect to the probability of the estimated information bits $u'_k$ being 0 is calculated according to expression (1) above. Also, note that $Lc \cdot x_k$ represents a communication channel value.

Subsequently, the first adder 86 calculates the extrinsic information for the second decoder 82 from the logarithmic likelihood ratio which are the result of above-mentioned calculations. The extrinsic information: $Le(u_k)$, k=1, 2, ..., N can be represented by the following expression (2) based on expression (1) above.

$$Le(u_k)=L(u_k)-Lc \cdot x_k-La(u_k) \qquad (2)$$

Here, note that $La(u_k)$ is equal to 0 in the first decoding because the priori information has not been calculated.

Then, the interleavers 83 and 84 permute the reception sequence x and the sequence of extrinsic information $Le(u_k)$ so as to match the time point of the reception sequence $Y_b$. The second decoder 82 calculates the logarithmic likelihood ratio: $L(u_k)$ based on the reception sequences x, $y_b$, $z_{u,\ b}$, $z_{b,\ p}$ and the extrinsic information: $Le(u_k)$ previously calculated, as in the first decoder 81. Thereafter, the second adder 87 calculates the extrinsic information: $Le(u_k)$ by using expression (2) above, as in the first adder 86. At this time, the extrinsic information permuted by the deinterleaver 85 is fed back to the first decoder 81 as the priori information: $La(u_k)$.

Finally, the iterative decoder calculates the logarithmic likelihood ratio with higher accuracy by repeatedly executing the above-mentioned processing over a prescribed number of times. The determiner 88 makes a determination based on the logarithmic likelihood ratio thus calculated thereby to estimate the original information bit sequence. Stated concretely, if the logarithmic likelihood ratio $L(u_k)$ is greater than zero ($L(u_k)>0$), it is determined that the estimated information bits: $u'_k$ is 1. If $L(u_k) \leq 0$, the estimated information bits: $u'_k$ is determined to be 0.

Here, the operation of the soft-input and soft-output decoder (the first decoder 81 and the second decoder 82) will be described concretely. The information bit sequence, the parity bit sequence and the tail bits generated by the convolutional encoder together form a diagram called a trellis consisting of branches (indicative of transitions of states)

and nodes (indicative of the states of the registers in the convolutional encoders). An MAP decoding shown in FIG. 14 searches for this trellis diagram based on a reception sequence, and estimates a transmitted information bit sequence.

Here, the state of each register is defined as $S_{j,\ k}$ (j is the decimal notation of the value of each register, and k represents the time point.). In addition, the labels of branches, which are passed when the information bit $u_k$ is input and the parity bit $p_k$ is output, are defined as $i_k=(u_k,\ p_k)$. First of all, a search is run through the trellis in a forward direction from time point k=1. Here, note that the a posteriori probability of the transmission information bit sequence having passed the state $S_{j,\ k}$ upon receipt of a reception sequence from time point 1 to time point k is defined as the forward path metric: $\alpha(S_{j,\ k})$. In step ST101, the initial value $\alpha(S_{j,\ 0})$ of the forward path metric $\alpha(S_{j,\ k})$ is set. This is set as shown in the following expression (3) according to the MAP decoding.

$$\alpha(S_{j,0}) = \begin{cases} 1, & \text{if } j=0 \\ 0, & \text{otherwise} \end{cases} \quad (3)$$

In step ST102, the time point k is set to 1. In step ST103, the concatenated probability: (branch metric $\gamma_{i,\ k}$) of a branch with a branch label $i_k$ being passed through is calculated. The calculation of the branch metric $\gamma_{i,\ k}$ varies depending on the state of communication channels and the modulation method. For instance, let us assume the case where BPSK modulation is performed in the white Gaussian noise communication channel. Assuming that a variance of noise is $\sigma^2$, and the amplitude values of the reception signals of information bits and parity bits are $x_k$ and $y_k$, respectively, the branch metric $\gamma_{i,\ k}$ is calculated as shown in the following expression (4).

$$\gamma_{i,k} = \exp\left\{ \frac{(2u_k-1)\cdot x_k}{\sigma^2} + \frac{(2p_k-1)\cdot y_k}{\sigma^2} + \frac{(2u_k-1)\cdot La(u_k)}{2} \right\} \quad (4)$$

where $La(u_k)$ is the priori information of the last but one extrinsic information.

In step ST104, the forward path metric $\alpha(S_{j,\ k})$, is calculated according to the following expressions (5) and (6).

$$\alpha(S_{j,k}) = h_{\alpha,k} \sum_i \alpha(S_{j',k-1}) \cdot \gamma_{i,k} \quad (5)$$

$$h_{\alpha,k} = \frac{1}{\sum_j \alpha(S_{j,k})} \quad (6)$$

where the summation in expression (5) above is calculated only for the branches which enter the state $S_{j,\ k}$. In step ST106, the forward path metric $\alpha(S_{j,\ k})$ thus calculated is stored in a memory. In step ST107, a comparison is made as to whether the time point k is equal to or larger than the block length N. When the time point k is smaller than the block length N, the time point k is incremented by 1, and step ST103 is carried out, whereas when the time point k is equal to or larger than the block length N, the forward path metric operation is ended.

Thereafter, a search is made for the trellis from time point k=N+T in a backward direction. Here, note that the a posteriori probability of the transmission information bit sequence having passed the state $S_{j,\ k}$ upon receipt of the reception sequence from time point k+1 to time point N+T is defined as the backward path metric: $\beta(S_{j,\ k})$. In step ST108, the initial value $\beta(S_{j,\ N+T})$ of the backward path metric $\beta(S_{j,\ k})$ is set. This is set as shown in the following expression (7) according to the MAP decoding.

$$\beta(S_{j,N+T}) = \begin{cases} 1, & \text{if } j=0 \\ 0, & \text{otherwise} \end{cases} \quad (7)$$

The reason for the initial value $\beta(S_{j,\ N+T})$ of the backward path metric $\beta(S_{j,\ k})$ being able to be set as shown in expression (7) above is that the trellis is converged to a node $(S_{0,\ N+T})$ of the initial state owing to the addition of the tail bits $t_u$, $t_p$. In step ST109, the time point k is set to N+T−1.

In ST110, the concatenated probability: (branch metric $\gamma_{i,\ K+1}$) of the branch with the branch label $i_k$ being passed through is calculated according to the above-mentioned expression (4). In step ST111, the backward path metric $\beta(S_{j,\ k})$ is calculated according to the following expressions (8) and (9).

$$\beta(S_{j,k}) = h_{\beta,k} \sum_i \beta(S_{j',k+1}) \cdot \gamma_{i,k+1} \quad (8)$$

$$h_{\beta,k} = \frac{1}{\sum_j \beta(S_{j,k})} \quad (9)$$

However, the summation in the expression (8) is calculated only for the branches which extend from the state $S_{j,\ k}$.

In step ST111, for time points k=N+T, N+T−1, . . . , N+1 corresponding to the tail bits, $x_k$ and $y_k$ in the expressions for calculating the branch metrics $\gamma_{i,\ k}$ are replaced by $z_{a,\ u,\ k}$ (or $z_{b,\ u,\ k}$ and $z_{a,\ p,\ k}$ (or $z_{b,\ p,\ k}$). In addition, the priori information $La(u_k)$ is assumed to be 0.

In step ST112, the logarithmic likelihood ratio $L(u_k)$ is calculated according to the following expressions (10)–(12).

$$L(u_k) = \ln \frac{\sum_{i_k, u_k=1} \sum_{S_{j,k}} \sigma(S_{j,k}, i_k)}{\sum_{i_k, u_k=0} \sum_{S_{j,k}} \sigma(S_{j,k}, i_k)} \quad (10)$$

$$\sigma(S_{j,k}, i_k) = h_{\sigma,k} \cdot \alpha(S_{j,k-1}) \cdot \gamma_{i,k} \cdot \beta(S_{j',k}) \quad (11)$$

$$h_{\sigma,k} = \frac{1}{\sum_{i_k} \sum_j \sigma(S_{j,k}, i_k)} \quad (12)$$

In step ST113, the extrinsic information $Le(u_k)$ is calculated by the aforementioned expression (2). Here, communication channel value: $Lc \cdot x_k$ in the current condition is calculated as shown by the following expression (13).

$$Lc \cdot x_k = \frac{2 \cdot (2u_k - 1) \cdot x_x}{\sigma^2} \quad (13)$$

Note that the calculations according to the expression (2) are carried out by the adders 86 and 87. In step ST114, a comparison is made as to whether the time point k is equal to or less than 2. When the time point k is larger than 2, k is decremented by 1 and the processing in step ST110 is carried out. When the time point k is equal to or less than 2, the backward path metric operation is ended, and the soft-input and soft-output decoding processing is also ended.

Note that for time points k=N+T, N+T−1, . . . , N+1 corresponding to the tail bits, the arithmetic operations in step ST112 and step ST113 are not carried out.

The known encoding method as constructed above has the following problems. That is, it is necessary to concurrently transmit the tail bits for initializing the registers of the encoders besides the information bit sequence and the parity bit sequences originally intended to be transmitted. The tail bits themselves are redundant, accordingly reducing the transmission efficiency. Moreover, it is necessary to secure areas for the tail bits in the transmission frames, thus giving limitations to the configuration of the transmission frames.

SUMMARY OF THE INVENTION

The present invention has been made in view of the above problems, and has for its object to provide an error correction encoding method and apparatus as well as an error correction decoding method and apparatus which do not require transmission of tail bits.

According to one aspect of the present invention, there is provided an error correction encoding method comprising: a turbo encoding step in which a transmission information bit sequence is divided into a plurality of frames, and registers in each recursive systematic convolutional encoder are initialized before turbo encoding of a first frame, and after turbo encoding of the first frame is carried out, a second frame and following frames are continuously subjected to turbo encoding without initializing the registers in each recursive systematic convolutional encoder before the turbo encoding of the second frame and the following frames; and a transmission termination processing step in which tail bits for initializing the registers in each recursive systematic convolutional encoder are calculated only after a final frame has been subjected to turbo encoding.

Preferably, in the transmission termination processing step, known pre-determined dummy bits which are not an information bit sequence to be transmitted are inserted into a final transmission frame from a certain time point to a final time point thereof.

Preferably, each of the divided frames is permuted in such a manner that a certain number of bits, among the transmission information bit sequence, which are input to a second one of the recursive systematic convolutional encoders at early time points follow a certain number of bits which are input to a first one of the recursive systematic convolutional encoders at early time points.

According to another aspect of the present invention, there is provided an error correction decoding method comprising: a buffering processing step in which a transmission information bit sequence is divided into a plurality of frames, and when a reception sequence is decoded in which noise is mixed with the transmission information bit sequence which has been subjected to turbo encoding without initializing registers in each recursive systematic convolutional encoder of a turbo encoder at a delimiter of each transmission frame, a reception sequence corresponding to a target frame to be decoded is buffered and at the same time a reception sequence corresponding to a frame following the target frame to be decoded is also buffered; an extraction processing step in which only reception sequences needed to be input to iterative decoding means are extracted from reception sequences of the following frame; a decoding processing step in which an estimate value of a transmission information bit sequence corresponding to the target frame to be decoded is calculated by the iterative decoding means; a final frame determination processing step in which it is determined whether the target frame to be decoded is a final reception frame; an operation mode switching processing step in which when the target frame to be decoded is a final reception frame, an operation procedure of the iterative decoding means is switched for the final reception frame; and a final frame decoding processing step in which an estimate value of the transmission information bit sequence corresponding to the target frame to be decoded is calculated by the iterative decoding means corresponding to the switched mode.

Preferably, in the final frame decoding processing step, a reception sequence is decoded in which noise is mixed with a transmission bit sequence into which known pre-determined dummy bits, which are not an information bit sequence to be transmitted, are inserted from a certain time point to a final time point of a final transmission frame.

Preferably, in the buffering processing step, when a reception sequence is decoded in which noise is mixed with a sequence whose order is permuted in such a manner that a certain number of bits, among the transmission information bit sequence, which are input to a second one of the recursive systematic convolutional encoders at early time points follow a certain number of bits which are input to a first one of the recursive systematic convolutional encoders at early time points, a reception sequence corresponding to the transmission information bit sequence is rearranged into its original order after a reception sequence corresponding to the target frame to be encoded is buffered.

According to a further aspect of the present invention, there is provided an error correcting encoding apparatus comprising: buffers for saving a transmission information bit sequence for each transmission frame; a first switch for switching between the buffers into which the transmission information bit sequence is saved; a second switch for switching between the buffers from which the transmission information bit sequence is input to a turbo encoder; a multiplexer for multiplexing the transmission information bit sequence and transmission parity bit sequences; transmission termination processing control means for performing control in such a manner that only a final transmission frame is subjected to transmission termination processing; and a tail bit calculator for calculating tail bits; wherein transmission frames are continuously encoded without initializing registers in recursive systematic convolutional encoders of the turbo encoder at a terminal end of each transmission frame, and without calculating tail bits.

Preferably, the error correction encoding apparatus further comprises a permuter for permuting the order of the transmission information bit sequence in such a manner that a certain number of bits, among the transmission information bit sequence, which are input to a second one of the recursive systematic convolutional encoders at early time points follow a certain number of bits which are input to a first one of the recursive systematic convolutional encoders at early time points.

According to a yet further aspect of the present invention, there is provided an error correction decoding apparatus comprising: buffers for saving a reception sequence for each reception frame; a first switch for switching between the buffers into which the reception sequence is saved; a second switch for switching between the buffers from which a reception sequence corresponding to a target frame to be decoded is retrieved; a third switch for switching between the buffers from which a reception sequence corresponding to a frame following the target frame to be decoded is retrieved; a first divider for dividing the reception sequence corresponding to the frame to be decoded and inputting the reception sequence thus divided to an iterative decoder; a second divider for extracting and dividing only necessary ones from among reception sequences corresponding to a frame following the target frame to be decoded and inputting the necessary ones thus extracted and divided to the iterative decoder; and reception termination processing control means for performing control in such a manner that only a final reception frame is subjected to reception termination processing; wherein the transmission information bit sequence is divided into a plurality of frames, and a reception sequence is decoded in which noise is mixed with a transmission bit sequence which has been subjected to turbo encoding without initializing registers in each recursive systematic convolutional encoder of a turbo encoder at a delimiter of each transmission frame.

Preferably, the error correction decoding apparatus further comprises an inverse permuter for rearranging a reception sequence corresponding to the transmission information bit sequence into its original order, wherein a reception sequence is decoded in which noise is mixed with a sequence whose order is permuted in such a manner that a certain number of bits, among the transmission information bit sequence, which are input to a second one of the recursive systematic convolutional encoders at early time points follow a certain number of bits which are input to a first one of the recursive systematic convolutional encoders at early time points.

The above and other objects, features and advantages of the present invention will become more readily apparent to those skilled in the art from the following detailed description of preferred embodiments of the present invention taken in conjunction with the accompanying drawings.

DESCRIPTION OF THE PREFERRED EMBODIMENTS

Hereinafter, preferred embodiments of the present invention will be described in detail while referring to the accompanying drawings.

First Embodiment

Figure 1:
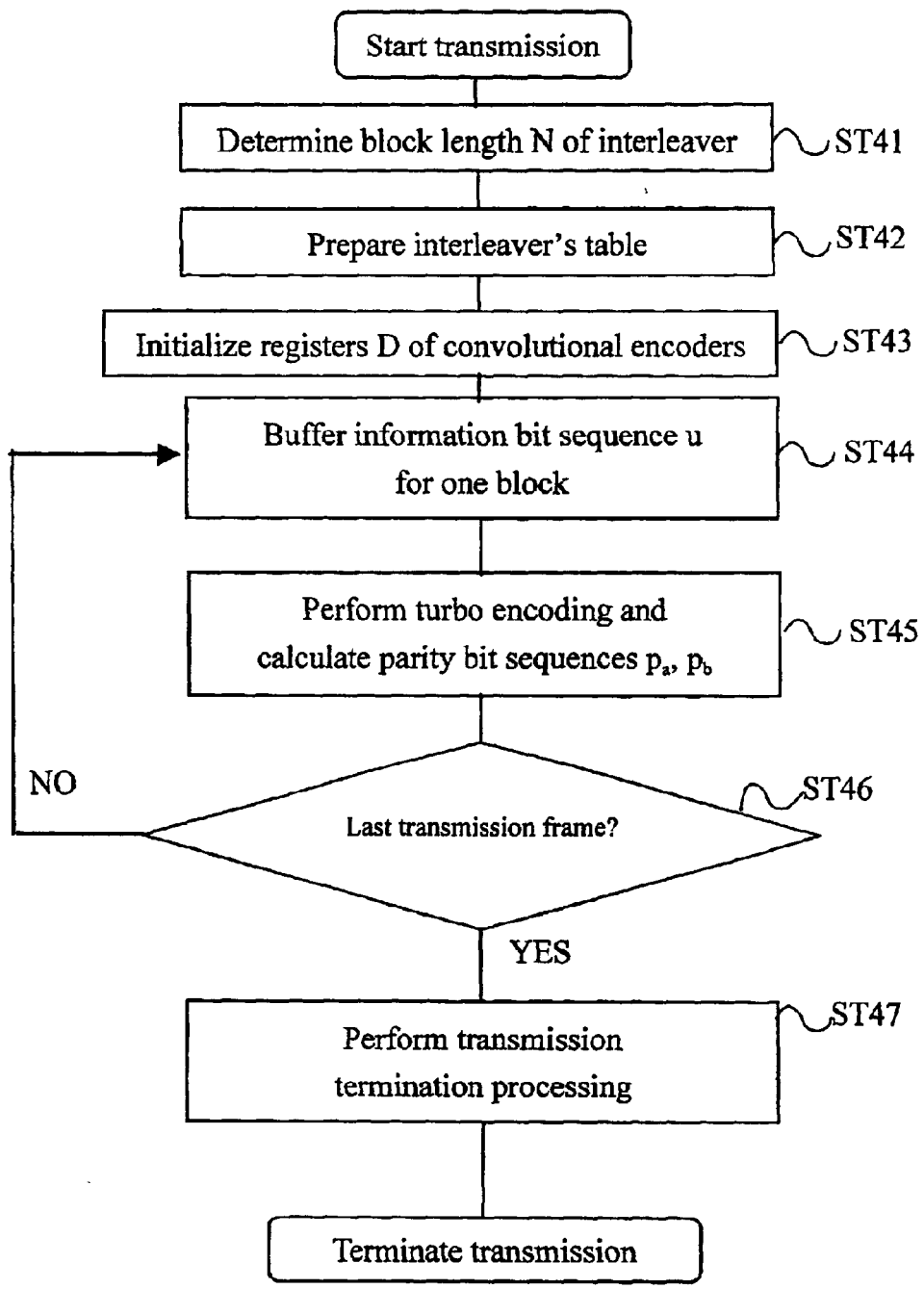
FIG. 1 is a flow chart illustrating a turbo encoding method according to a first embodiment of the present invention.
Figure 11:
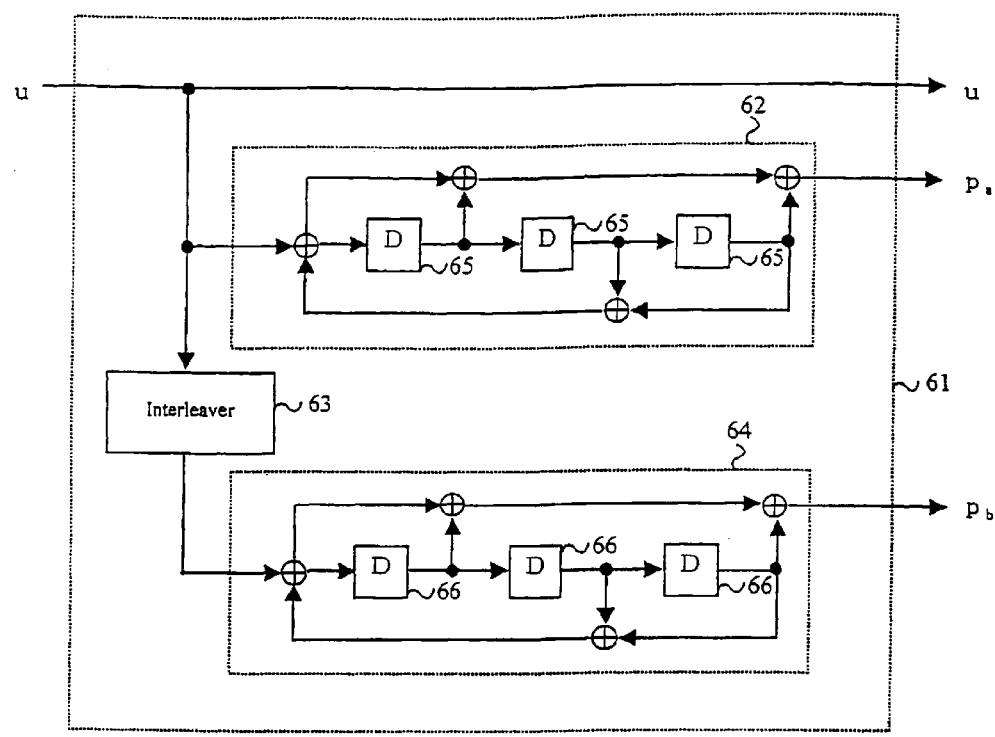
FIG. 11 is a view illustrating the configuration of a turbo encoder used at the sending side in the known turbo encoding method.
Figure 12:
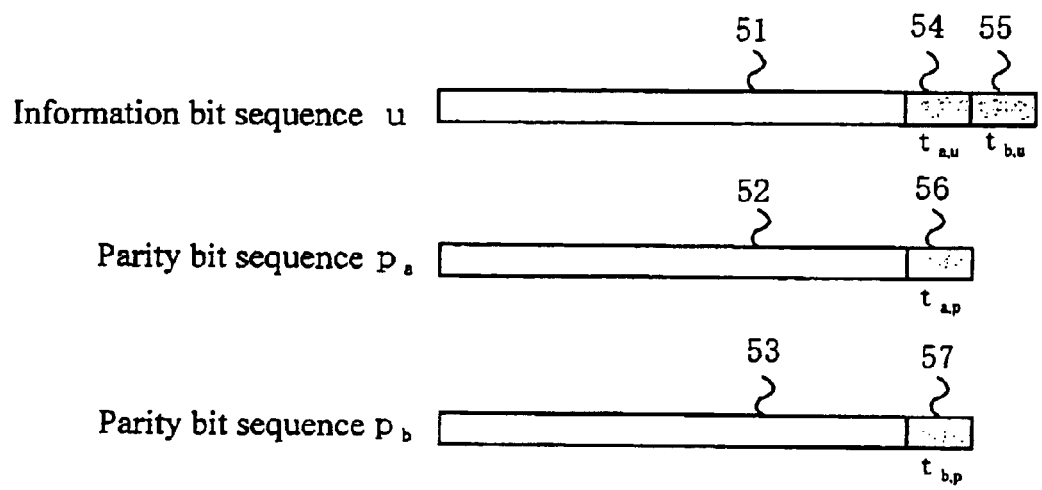
FIG. 12 is a view illustrating the configurations of an information bit sequence and parity bit sequences which are encoded by the known encoding method and each combined into one frame.
Figure 13:
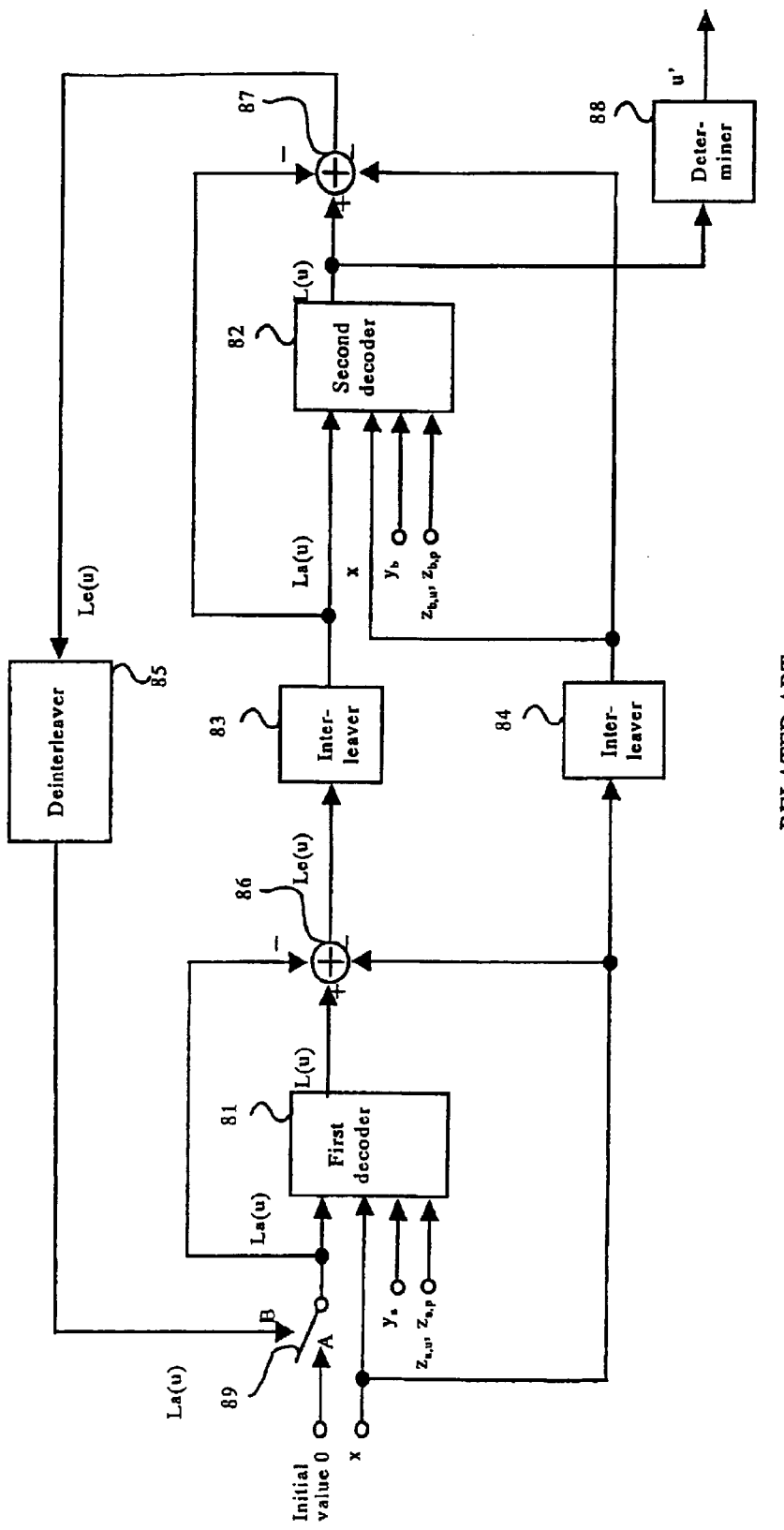
FIG. 13 is a view illustrating the configuration of an iterative decoder used at the receiving side in the known turbo encoding method.
Figure 14:
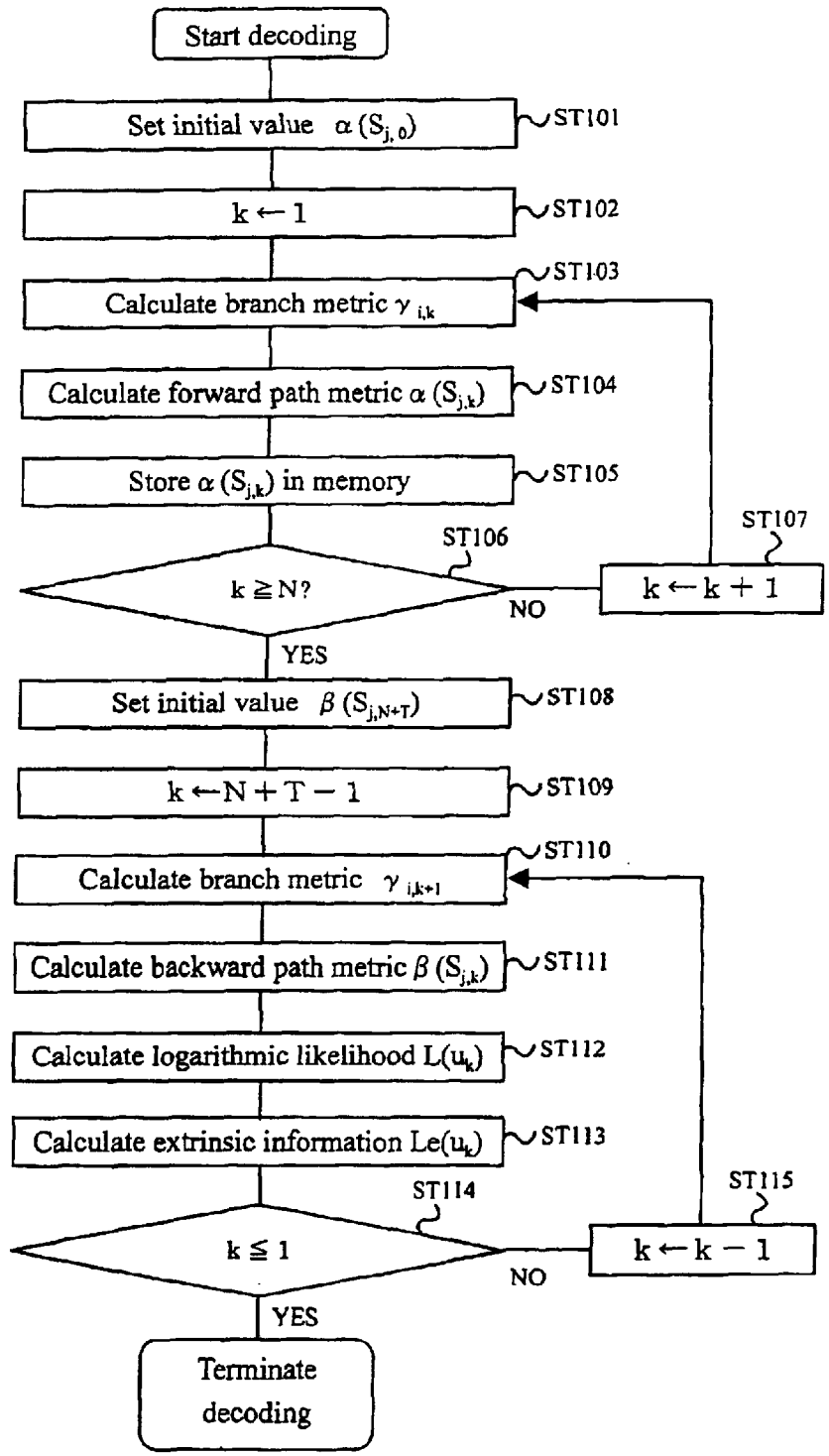
FIG. 14 is a flow chart illustrating an MAP (maximum a posteriori) decoding method which is one technique of a calculation means of a soft-input and soft-output decoder used at the receiving side in the known turbo encoding method.

FIG. 1 is a flow chart which shows an error correction encoding method according to a first embodiment of the present invention, and this method is implemented by using the turbo encoder 61 shown in FIG. 11 as in the aforementioned known example. In FIG. 1, ST41 designates a processing step for determining the block length N of the interleaver 63 at the start of transmission. ST42 designates a processing step for preparing an interleaver pattern of the block length N. ST43 designates a processing step for initializing the values of the registers 65 of the first convolutional encoder 62 and the values of the registers 66 of the second convolutional encoder 64, which will be described later. ST44 designates a processing step for buffering an information bit sequence u for one block. ST45 designates a processing step for turbo encoding and outputting parity bit sequences $p_a$ and $p_b$ by means of the turbo encoder 61. ST46 designates a processing step for determining whether a frame under processing is the last one and performing switching the processing operation. ST47 designates a processing step for performing transmission termination processing for the last or final transmission frame.

Figure 2:
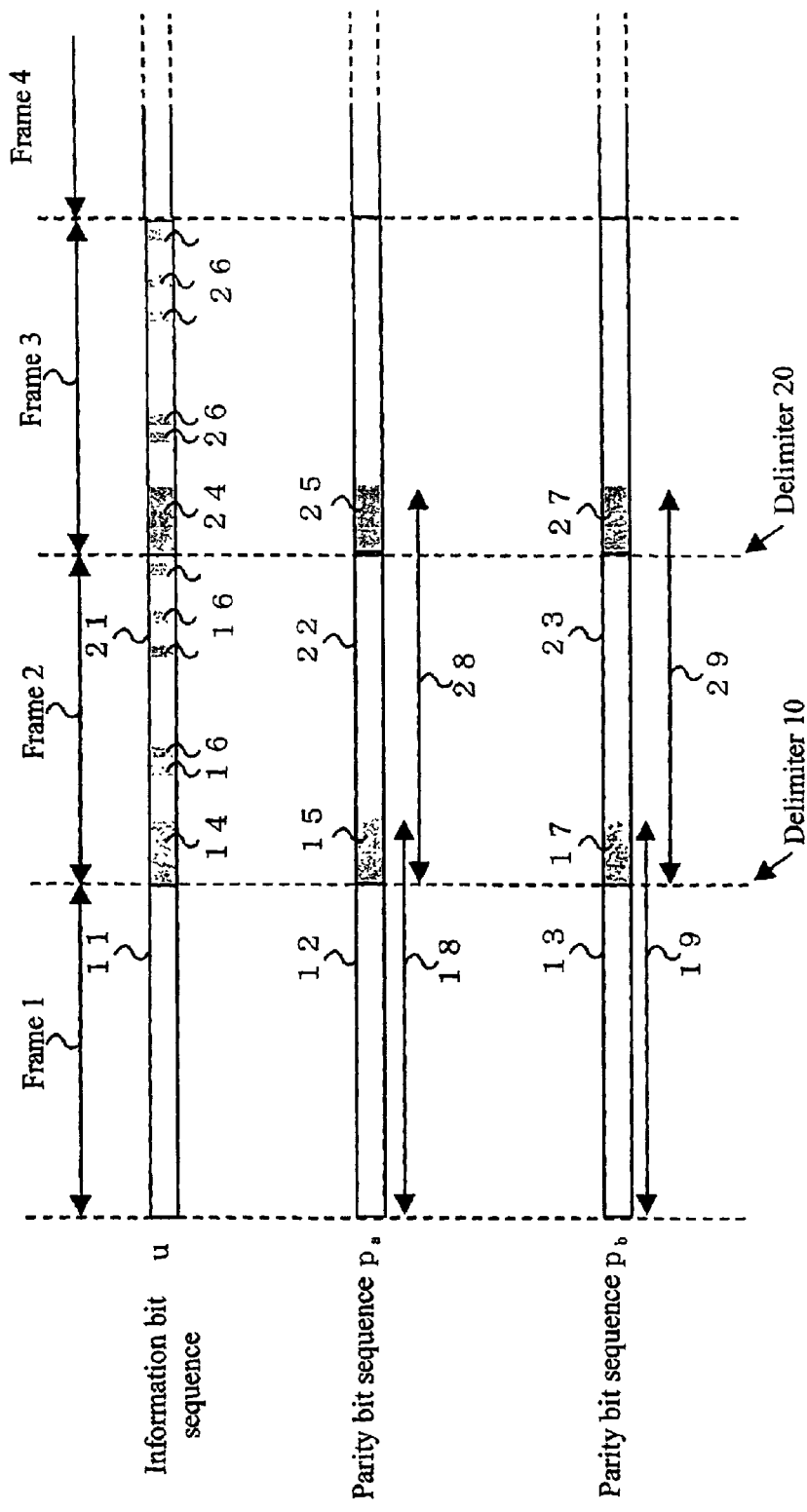
FIG. 2 is a view illustrating the configuration of a transmission frame prepared by the turbo encoding method according to the first embodiment of the present invention.

In addition, FIG. 2 is a view illustrating a transmission frame configuration prepared by a turbo encoding method according to the first embodiment of the present invention. In FIG. 2, 10 designates a separator or delimiter between a first transmission frame 1 and a second transmission frame 2. 11 designates a transmission information bit sequence u of the first transmission frame 1. 12 designates a transmission parity bit sequence $p_a$ of the first transmission frame 1. 13 designates a transmission parity bit sequence $p_b$ of the first transmission frame 1. 14 designates a range representing information bits of the information bit sequence u in the second transmission frame 2 included in a decoding range 18. 15 designates a range representing parity bits of the parity bit sequence $p_a$ in the second transmission frame 2 included in the decoding range 18. 16 designates a range representing information bits of the information bit sequence u in the second transmission frame 2 included in a decoding range 19. 17 designates a range representing parity bits of the parity bit sequence $p_b$ in the second transmission frame 2 included in the decoding range 19. 18 designates a range of a reception sequence which is input to the first decoder 81 in the iterative decoding of the first transmission frame 1. 19 designates a range of a reception sequence which is input to the second decoder 82 in the iterative decoding of the first transmission frame 1.

20 designates a delimiter between the second transmission frame 2 and a third transmission frame 3. 21 designates a transmission information bit sequence u of the second transmission frame 2. 22 designates a transmission parity bit sequence $p_a$ of the second transmission frame 2. 23 designates a transmission parity bit sequence $p_b$ of the second transmission frame 2. 24 designates a range representing information bits of the information bit sequence u in the third frame 3 included in a decoding range 28. 25 designates a range representing parity bits of the parity bit sequence $p_a$ in the third frame 3 included in the decoding range 28. 26 designates a range representing information bits of the information bit sequence u in the third frame 3 included in a decoding range 29. 27 designates a range representing parity bits of the parity bit sequence $p_b$ in the third frame 3 included in the decoding range 29. 28 designates a range of a reception sequence which is input to the first decoder 81 in the iterative decoding of the second transmission frame 2. 29 designates a range of a reception sequence which is input to the second decoder 82 in the iterative decoding of the second transmission frame 2.

Figure 3:
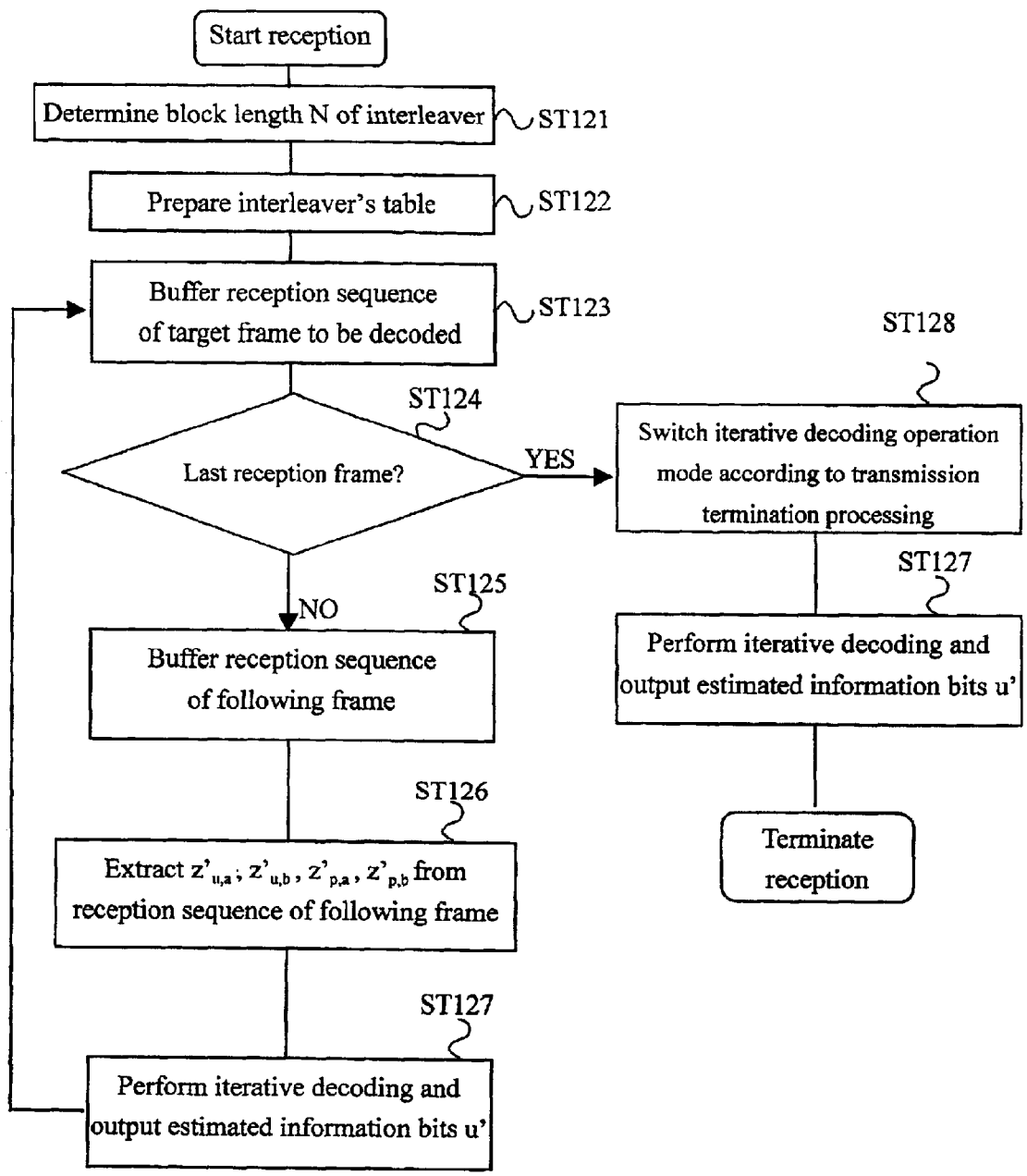
FIG. 3 is a flow chart illustrating an error correction decoding method according to the first embodiment of the present invention.

FIG. 3 is a view illustrating a decoding method according to the first embodiment of the present invention. In FIG. 3, ST121 designates a processing step for determining the block length N in the interleaver at the start of reception. ST122 designates a processing step for preparing an interleaver pattern of the block length N. ST123 designates a processing step for receiving and buffering a reception sequence corresponding to a target frame which is intended to be subjected to decoding processing. ST124 designates a processing step for determining whether the target frame to be decoded is the last or final reception frame. ST125 designates a processing step for receiving and buffering a reception sequence corresponding to a frame following the target frame to be decoded. ST126 designates a processing step for extracting, from the reception sequence of the following frame, reception sequences which correspond to the area 14, area 15, area 16 and area 17 in FIG. 2 and which are required to be input to the iterative decoding means, and for saving them in a memory. ST127 designates a processing step for performing iterative decoding and outputting an estimated information bit sequence u'. ST128 designates a processing step for switching the operation mode of the iterative decoding means according to a transmission termination method which is carried out during transmission when the target frame to be decoded is the final reception frame.

Now, reference will be made to the operation of this embodiment. First of all, reference will be made of a processing procedure from the start of transmission to the end of transmission. As shown in FIG. 1, at first, the block length N of the interleaver 63 is determined in step ST41. Then, an interleaver pattern for the block length N is prepared in step ST42.

The registers 65 of the first convolutional encoder 62 and the registers 66 of the second convolutional encoder 64 are initialized in step ST43. These initializations are carried out only at the start of transmission, but not at delimiters between the transmission frames. The present invention is greatly different from the known art in this respect.

An information bit sequence u for one frame is buffered in step ST44. Turbo encoding of the frame is carried out to output transmission parity bits $p_a$, $p_b$ in step ST45.

In step ST46, it is determined whether the transmission frame being now processed is the last one. When the frame being processed is not the last one, a return is performed to step ST44 where the turbo encoding processing of the following frame is carried out. When the frame being processed is the last one, the termination of the transmission is carried out in ST47.

There are various techniques for transmission termination processing. For instance, one example is a method of adding tail bits to only the last or final transmission frame. Also, there is another method in which the final transmission frame is made a complete dummy frame, so that transmission is performed of the result of inputting a sequence of known (pre-determined) bits, which is not any information bit sequence to be transmitted, to the convolutional encoders. In addition, there may be considered a further method of transmitting a frame comprising an information bit sequence to be transmitted until time point k=N−T' and a dummy bit sequence (known pre-determined bits other than any information bit sequence to be transmitted) from time point k=N−T'+1 to time point k=N. The transmission termination processing is completed in this manner, thereby terminating a series of transmission processing.

As described above, according to the turbo encoding method of the present invention, the initialization of the convolutional encoders is not carried out at delimiters between transmission frames. Accordingly, tail bits necessary for initialization need not be added, and hence it is possible to avoid reduction in the transmission efficiency due to the tail bits. In addition, there is no need of securing areas for tail bits in transmission frames, thus making it possible to simplify the configuration of the transmission frames.

However, when tail bits are deleted, there arises an disadvantage of decreasing the performance of iterative decoding. The reason is as follows. That is, when the forward path metric $\alpha(S_{j,k})$ and the backward path metric $\beta(S_{j,k})$ are calculated during the MAP decoding, initial values $\alpha(S_{j,0})$ and $\beta(S_{j,N+T})$ are set for these path metrics, respectively. It is evident that the branches of the trellis extend only from state $S_{0,0}$ at time point k=0, and converge into state $S_{0,N+T}$ at time point k=N+T, so these initial values include the meaning that this constraint is weighted in the path metric calculations.

Here, note that tail bits are necessary to converge the branches into the state $S_{0,N+T}$ at time point k=N+T If the tail bits are deleted, the initial value $\beta(S_{j,N+T})$ cannot be set according to the expression (7) described above. Thus, the accuracy in the calculation result of the backward path metric $\beta(S_{j,k})$ decreases in a range near time point k=N because constraints due to trellis terminal ends can not be weighted. As a result, the performance of the iterative decoding is reduced.

At the frame delimiter 10 in FIG. 2, the first convolutional encoder 62 and the second convolutional encoder 64 do not calculate tail bits of the first transmission frame 1 but perform encoding of the frame 2 while keeping the states of the registers. Thus, the parity bit sequences in the area 15 and the area 17 are subjected to the constraint of the first transmission frame 1.

Accordingly, when the backward path metric $\beta(S_{j,k})$ is calculated during MAP decoding, calculations are started not from the frame delimiter 10, i.e., time point k=N, but from the tail end in the area 15 (or area 17) of the second transmission frame 2. Assuming that the width of bits in the area 15 (or, area 17) is T' and the number of registers in the convolutional encoders is d, the initial value $\beta(S_{j,N+T'})$ of the backward path metric $\beta(S_{j,k})$ is set as follows.

$$\beta(S_{j,N+T'}) = \frac{1}{2^d}, j = 0, 1, \ldots, 2^d - 1 \qquad (14)$$

The backward path metric $\beta(S_{j,k})$ is calculated according to the aforementioned expression (8) for k=N+T'−1, N+T'−2, ..., N+1. However, let us assume $La(u_k)=0$ in the calculations of the branch metrics $\gamma_{i,k}$, k=N+T'−1, N+T'−2, . . . , N+1. Moreover, calculations of the logarithmic likelihood ratio $L(u_k)$ and the extrinsic information $Le(u_k)$ are not performed in the calculations of k=N+T'−1, N+T'−2, . . . , N+1. If the bit width T' in the area 15 (or area 17) is sufficiently large, it will be possible to avoid the reduction in the accuracy of the calculation result of the backward path metric $\beta(S_{j,k})$ in a range near time point k=N.

On the other hand, the initial value $\alpha(S_{j,0})$ of the forward path metric $\alpha(S_{j,k})$ is calculated as follows. The first transmission frame 1 is calculated by the aforementioned expression (3). From the second transmission frame 2 onward, the forward path metric $\alpha(S_{j,N})$ of the preceding frame at time point N is assumed to be the initial value $\alpha(S_{j,0})$ of the forward path metric of the target frame to be decoded.

The area of the information bit sequence u corresponding to the area 15 of the parity bit sequence $p_a$ is the area 14, and the area of the information bit sequence u corresponding to the area 17 of the parity bit sequence $p_b$ is the area 16. The area 14 corresponds to the leading or head portion of the information bit sequence u of the second transmission frame 2. However, the area 16, in which the information bit sequence u input to the second convolutional encoder 64 is interleaved, is scattered in the whole area of the information bit sequence u of the second transmission frame 2. The iterative decoding cannot be started until all the reception sequences, which should be decoded, have been received. Thus, in the above decoding method, the decoding of the first transmission frame 1 is started after the whole second transmission frame 2 has been received. Similarly, the decoding of the second transmission frame 2 is started after the whole third frame 3 has been received. Therefore, a delay for one frame is generated before the calculation of the decoding results.

The processing of the above-mentioned decoding method is shown in the flow chart of FIG. 3. Now, the operation of the decoding method of FIG. 3 will be described below. First of all, the block length N of the interleaver is decided in step ST121. Then, an interleaver pattern for the block length N is prepared in step ST122.

In step ST123, a reception sequence corresponding to a target frame to be decoded is received and buffered. In step ST124, it is determined whether the target frame to be decoded is the final or last reception frame. If the target frame to be decoded is not the final reception frame, a reception sequence corresponding to a frame following the target frame to be decoded is received and buffered in step ST125. In step ST126, reception sequences $z'_{u,a}, z'_{p,a}, z'_{u,b}, z'_{p,b}$ corresponding to the area 14, area 15, area 16 and area 17 in FIG. 2 are extracted from the reception sequences of the following frame and saved in a memory.

In step ST127, iterative decoding is carried out from a reception sequence x in which noise is mixed with the information bit sequence u, reception sequences $y_a$ and $y_b$ in which noise is mixed with parity bit sequences $p_a$ and $p_b$, and the reception sequences $z'_{u,a}, z'_{p,a}, z'_{u,b}, z'_{p,b}$, to output the estimated information bit sequence u'. Thereafter, a return is performed to step ST123 where the decoding processing for the following target frame to be decoded is continued.

On the other hand, when it is determined in step ST124 that the target frame to be decoded is the final reception frame, processing of switching the operation mode of the iterative decoding means is carried out according to a method of processing transmission termination during transmission in step ST128. When a method of adding tail bits to only the final frame is carried out as transmission termination processing, reception sequences $z_{a,u}, z_{b,u}, z_{a,p}, z_{b,p}$ corresponding to tail bits are extracted, and they are input to the iterative decoder together with the reception sequence x corresponding to the information bit sequence u and the reception sequences $y_a, y_b$ corresponding to the parity bit sequences $p_a, p_b$ and are subjected to decoding processing. Moreover, when the final frame is a dummy frame, the decoding operation is ended without performing any processing for the concerned target frame to be decoded. In addition, when the method of adding dummy bits from time point k=N−T'+1 to time point k=N is performed, iterative decoding is carried out without calculating the logarithmic likelihood ratio $L(u_k)$, k=N−T'+1, N−T'+2, . . . , N, and the extrinsic information $Le(u_k)$, k=N−T'+1, N−T'+2, . . . , N.

Here, note that in the first embodiment, the turbo symbol, in which the number of input information bits is 1 and the number of output parity bits is 2, has been concretely described. However, there are a wide variety of parameters for the turbo symbol applicable to the first embodiment, including, for example, such cases as two or more input information bits, three or more parity bits, punctured parity bits, and so on.

As described above, in the first embodiment, the initialization of the convolutional encoders is not carried out at delimiters between transmission frames, and hence there is provided an effect that tail bits necessary for initialization need not be added. Accordingly, reduction in the transmission efficiency due to the tail bits can be avoided. In addition, there is no need for securing areas for the tail bits in the transmission frames, so the configuration of the transmission frames can be made more straightforward. The first embodiment exerts an extremely suitable effect when applied in particular to such forms of communications as satellite communications, etc., in which transmission or reception continues for a long period of time.

Second Embodiment

Figure 4:
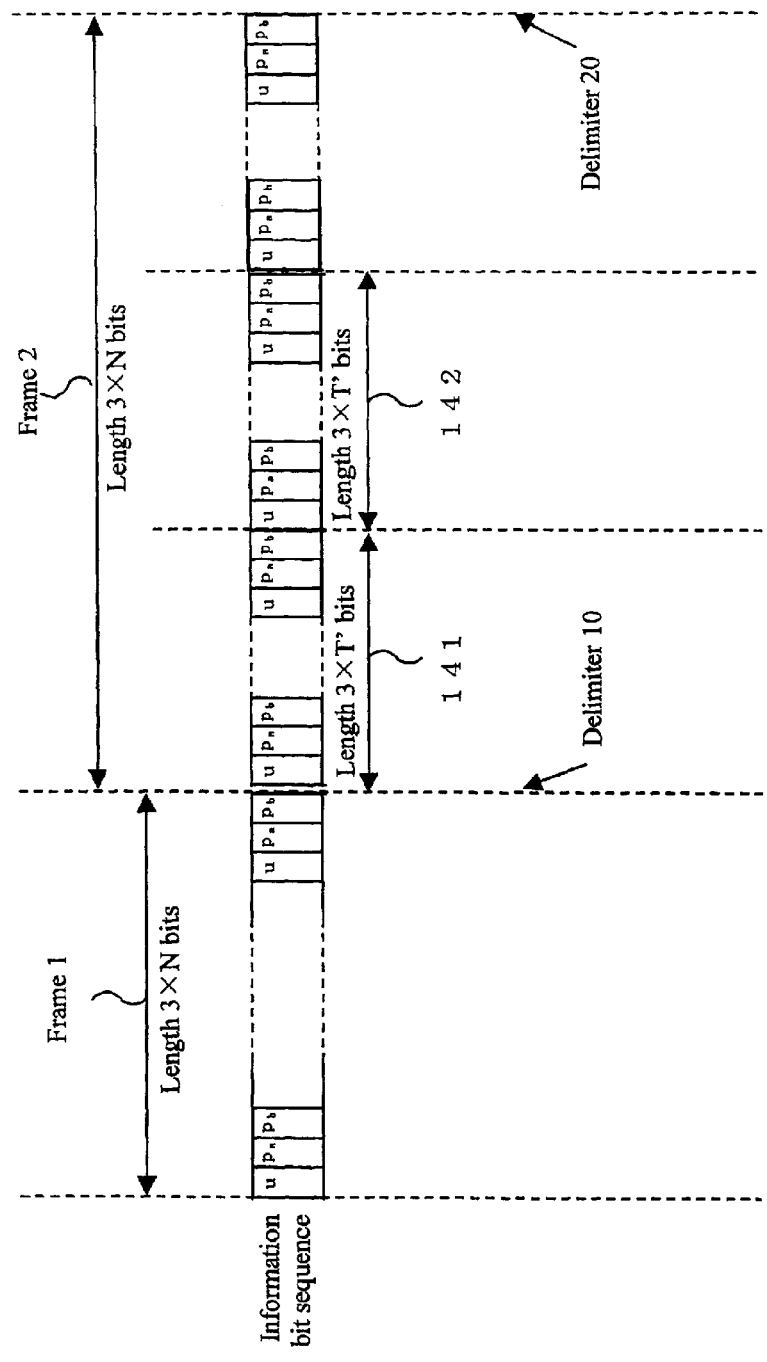
FIG. 4 is a view illustrating a transmission sequence prepared by serially permuting information bit sequences and parity bit sequences encoded by a turbo encoding method according to the second embodiment of the present invention.

FIG. 4 shows a transmission sequence comprising an information bit sequence and a parity bit sequence serially permuted which are encoded by a turbo encoding method according to a second embodiment of the present invention. In FIG. 4, 141 designates a partial frame in which an information bit $u_k$ corresponding to the area 14 in the frame 2, a parity bit $p_{b,k}$ corresponding to the area 15 in the same frame, and a parity bit $p_{a,k}$ corresponding to the area 17 in the same frame are arranged in the order of $(u_k, p_{a,k}, p_{b,k})$. 142 designates a partial frame in which an information bit $u_k$ corresponding to the area 16 in the frame 2, a parity bit $p_{a,k}$ following the area 15 included in a parity bit sequence 22, and a parity bit $p_{b,k}$ following the area 17 included in a parity bit sequence 23 are arranged in the order of $(u_k, p_{a,k}, p_{b,k})$.

Figure 5:
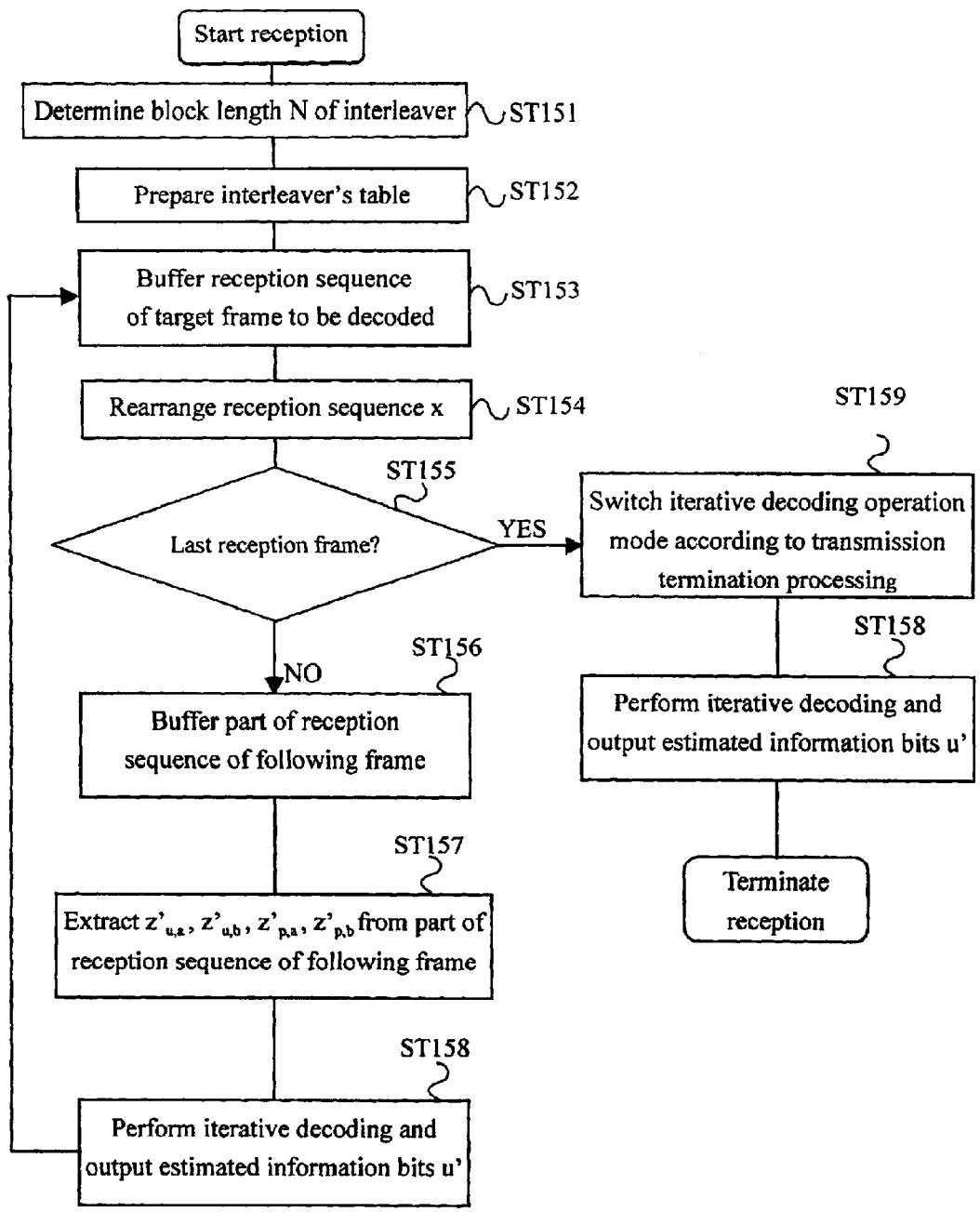
FIG. 5 is a flow chart illustrating an error correction decoding method according to the second embodiment of the present invention.

In addition, FIG. 5 shows an error correction decoding method according to the second embodiment of the present invention. In FIG. 5, ST151 designates a processing step for determining the block length N of the interleaver at the start of reception. ST152 designates a processing step for preparing an interleaver pattern of the block length N. ST153 designates a processing step for receiving and buffering a target frame intended to be subjected to decoding processing. ST154 designates a processing step for rearranging the order of the reception sequence x included in the target frame to be decoded into the original order. ST155 designates a processing step for determining whether the target frame to be decoded is the final frame. ST156 designates a processing step for receiving and buffering reception sequences for the first 6×T' time points of a frame following the target frame to be decoded. ST157 designates a processing step for extracting the reception sequences corresponding to the area 14, area 15, area 16 and area 17 in FIG. 2 from the reception sequences of the following frame buffered in the step ST156 and saving them in a memory. ST158 designates a processing step for performing iterative decoding and outputting an estimated information bit sequence u'. ST159 designates a processing step for switching the operation mode of the iterative decoding means by a method of processing transmission termination during transmission when the target frame to be decoded is the final reception frame.

Now, the operation of the second embodiment will be described below. In the first embodiment, the information bit sequence u and the parity bit sequences $p_a$, $p_b$ encoded as shown in FIG. 2 are serially permuted in the order of ($u_k$, $p_{a,k}$, $p_{b,k}$), k=1, 2, ..., N, and then input to the modulator which transmits an output signal. When the frame 1 is decoded at the receiving side, the decoding can not be done until all the reception sequences corresponding to the area 16 in the frame 2 have been received. That is, the reception sequences corresponding to the area 16 scatter over the whole frame 2, so the decoding can not be started until all the reception sequences corresponding to the frame 2 have been received.

In contrast, the second embodiment of the present invention can solve such a problem. After the information bit sequence u for one frame has been input to the encoder at the sending side and the parity bit sequences $p_a$, $p_b$ have been output therefrom, and before the information bit sequence u and the parity bit sequences $p_a$, $p_b$ are serially permuted, information bits $u_{tb,k}$ (i.e., those which are input to the second convolutional encoder 64 at time point k (k=1, 2, ... T')) corresponding to the area 16 of the information bit sequence u are retrieved and inserted just after the information bits $u_{ta,k}$ (i.e., those which are input to the first convolutional encoder 62 at time point k (i.e., k=1, 2, ..., T')) corresponding to the area 14. However, those among the bits $u_{tb,k}$ which are also $u_{ta,k}$ are not retrieved and left just as they are. After such an information bit sequence u is permuted, the information bit sequence u and the parity bit sequences $p_a$, $p_b$ are serially rearranged in the order of ($u_k$, $p_{a,k}$, $p_{b,k}$), k=1, 2, ..., N, as shown in FIG. 4.

At the decoding side, the block length N of the interleaver is first determined in step ST151, as shown in FIG. 5. Then, an interleaver pattern for the block length N is prepared in step ST152. After a reception sequence corresponding to the target frame to be decoded is received in step ST153, the order of the reception sequence x corresponding to the information bit sequence is rearranged as before in step ST154.

When it is determined in step ST155 that the concerned target frame to be decoded is not the final reception frame, a reception sequence corresponding to the first 6×T' bits of the following frame is received and buffered in step ST156. In step ST157, reception sequences $z'_{u,a}$, $z'_{p,a}$, $z'_{u,b}$, $z'_{p,b}$ corresponding to the area 14, area 15, area 16 and area 17 in FIG. 2 necessary for calculating the backward path metric $\beta(S_{j,k})$ are extracted from among the buffered reception sequences and saved in a memory.

In step ST158, iterative decoding is carried out from the reception sequence x in which noise is mixed with the information bit sequence u, the reception sequence $y_a$, $y_b$ in which noise is mixed with the parity bit sequences $p_a$, $p_b$, and the reception sequences $z'_{u,a}$, $z'_{p,a}$, $z'_{u,b}$, $z'_{p,b}$, thereby to output an estimated information bit sequence u'. Thereafter, a return is performed to step ST153 where the decoding processing of the following target frame to be decoded is continued.

On the other hand, when it is determined in step ST155 that the target frame to be decoded is the final reception frame, the processing of switching the operation mode of the iterative decoding means is carried out according to a method of processing transmission termination during transmission in step ST159. In cases where a method of adding tail bits only to the final frame is taken as the transmission termination processing, the reception sequences $Z_{a,u}$, $z_{b,u}$, $z_{a,p}$, $z_{b,p}$ corresponding to the tail bits are extracted and input to the iterative decoders together with the reception sequence x corresponding to the information bit sequence u and the reception sequences $y_a$, $y_b$ corresponding to the parity bit sequences $p_a$, $p_b$, so that decoding processing is carried out by the iterative decoder.

Moreover, when the final frame is a dummy frame, the decoding operation is terminated without performing any processing to the concerned target frame to be decoded. Also, in cases where a method of adding dummy bits from time point k=N−T'+1 to time point k=N is performed, the iterative decoding is carried out without calculating the logarithmic likelihood ratio $L(u_k)$, k=N−T'+1, N−T'+2, ..., N, and the extrinsic information $Le(u_k)$, k=N−T'+1, N−T'+2, ..., N.

In the second embodiment, being different from the first embodiment in which iterative decoding is started after all the reception sequences of the following frame have been received, iterative decoding is started after only parts of the areas 141 and 142 of the reception sequences of the following frame have been received. The second embodiment is greatly distinct in this respect from the first embodiment. All the reception sequences $z'_{u,a}$, $z'_{p,a}$, $z'_{u,b}$, $z'_{p,b}$ corresponding to the area 14, area 15, area 16 and area 17 in FIG. 2 necessary for calculating the backward path metric $\beta(S_{j,k})$ are included in the reception sequences corresponding to the areas 141 and 142, so it becomes possible to perform the iterative decoding immediately after the step ST157 has been completed.

Although in the second embodiment, a concrete description has been made with respect to a turbo symbol in which the number of input information bits is one and the number of output parity bits is two, there are a wide variety of parameters for the turbo symbol applicable to the second embodiment, including, for example, such ones as having two or more input information bits or three or more parity bits, ones puncturing the parity bits, and so on.

As described above, in the second embodiment, those of the information bit sequence u which are input to the second convolutional encoder 64 at time point k (k=1, 2, ..., T') are retrieved at the sending side, and inserted immediately after those which have been input to the first convolutional encoder 62 at time point k (k=1, 2, ..., T'), and thereafter the information bit sequence u and the parity bit sequences $p_a$, $p_b$ are serially permuted in the order of ($u_k$, $p_{a,k}$, $p_{b,k}$), k=1, 2, ..., N, whereby the iterative decoding can be started at the receiving side after only part of the reception sequences of the second frame has been received, thus making it possible to reduce the delay in decoding. The second embodiment exerts an extremely suitable effect particularly when applied to such forms of communications as satellite communications, etc., in which transmission or reception continues for a long period of time.

Third Embodiment

Figure 6:
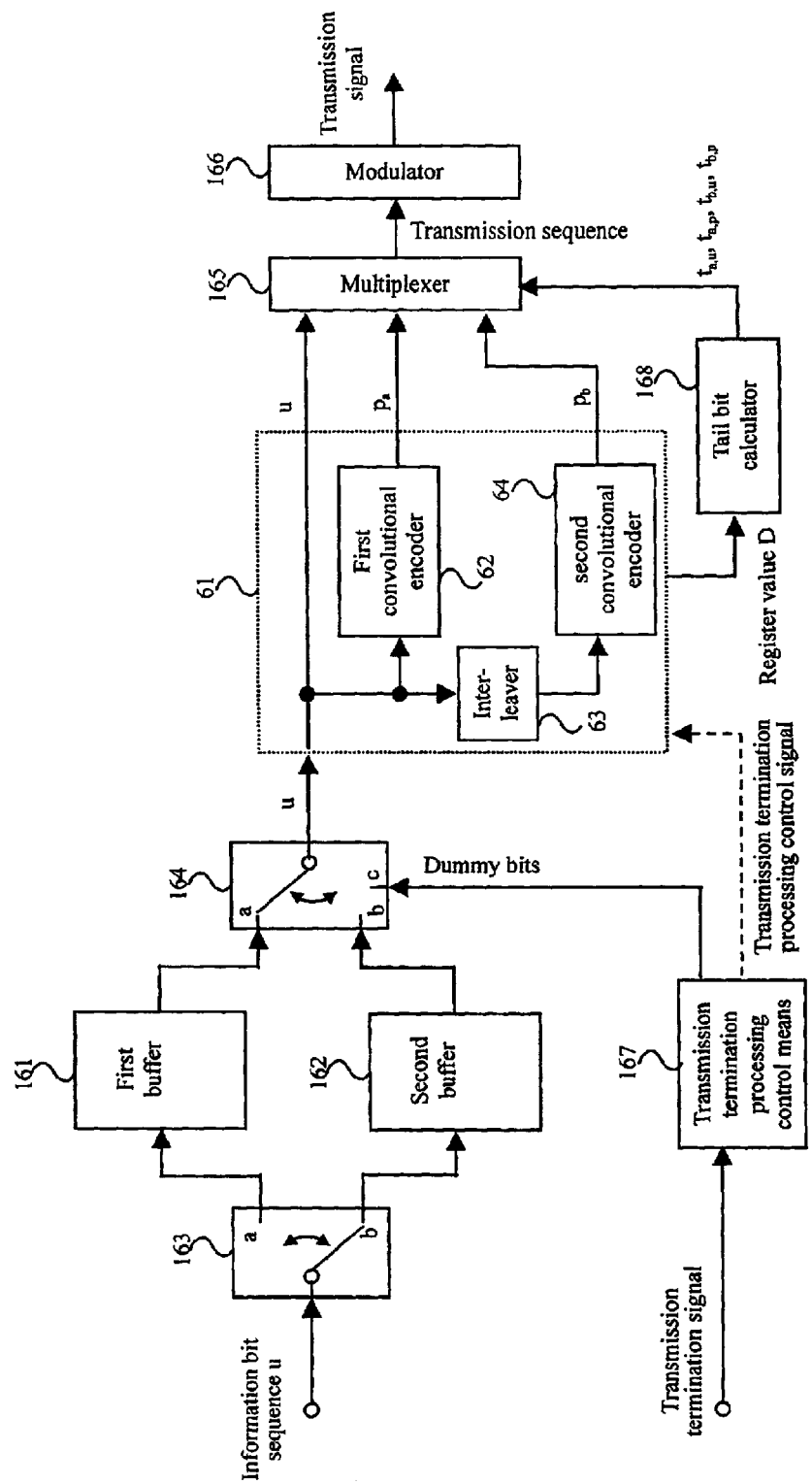
FIG. 6 is a view illustrating the configuration of an encoder according to a third embodiment of the present invention.

FIG. 6 shows an encoder according to a third embodiment of the present invention. In FIG. 6, a turbo encoder 61 includes a first convolutional encoder 62 for convolutionally encoding an information bit sequence u thereby to output a parity bit sequence $p_a$, an interleaver 63, and a second convolutional encoder 64 for convolutionally encoding the information bit sequence u permuted by the interleaver 63 thereby to output a parity bit sequence $p_b$.

A first buffer 161 buffers the transmission information bit sequence u for each transmission frame. Also, a second buffer 162 buffers the transmission information bit sequence u for each transmission frame. A switch 163 switches between the first and second buffers 161, 162 into which the transmission information bit sequence u is saved. A switch 164 switches between the first and second buffers 161, 162 from which the transmission information bit sequence u is input to the turbo encoder 61. A multiplexer 165 converts the transmission information bit sequence u and the transmission parity bit sequences $p_a$, $p_b$ into a serial sequence. A modulator 166 modulates a transmission sequence output from the multiplexer 165 into a transmission signal. A transmission termination processing control means 167 controls the transmission termination processing which is performed on the last or final transmission frame at the end of transmission. A tail bit calculator 168 calculates tail bits.

Figure 7:
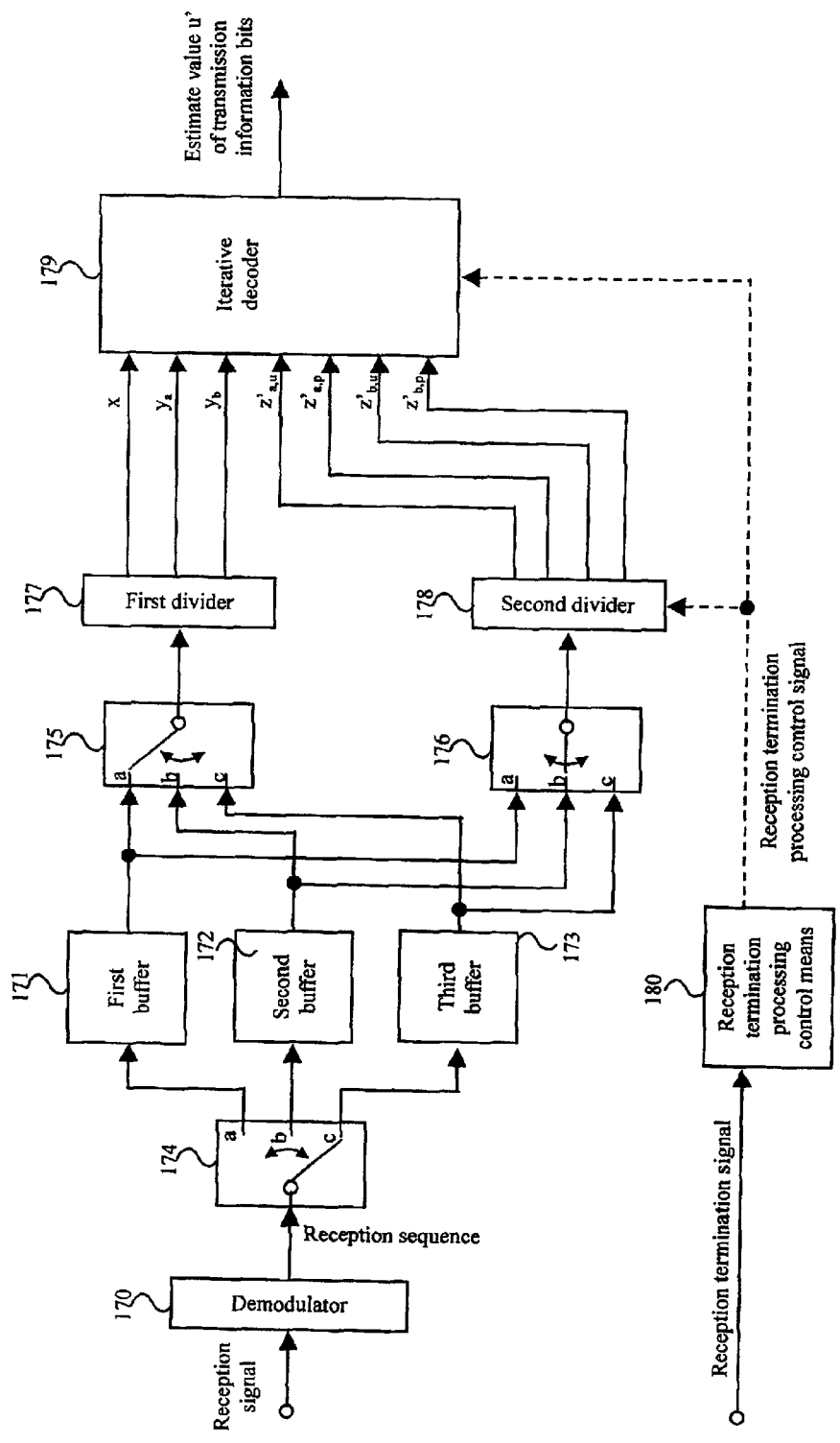
FIG. 7 is a view illustrating the configuration of a decoder according to the third embodiment of the present invention.

In addition, FIG. 7 shows a decoder according to the third embodiment of the present invention. In FIG. 7, a demodulator 170 receives a reception signal and outputs a reception sequence. A first buffer 171 buffers the reception sequence from the demodulator 170 for each received frame. A second buffer 172 also buffers the reception sequence from the demodulator 170 for each received frame. A third buffer 173 also buffers the reception sequence from the demodulator 170 for each received frame. A switch 174 switches between the first, second and third buffers 171, 172, 173 into which the reception sequence is saved. A switch 175 switches between the first, second and third buffers 171, 172, 173 from which a reception sequence corresponding to a target frame to be decoded is input to an iterative decoder 179. A switch 176 switches between the first, second and third buffers 171, 172, 173 from which a reception sequence corresponding to a frame following the target frame to be decoded is input to the iterative decoder 179.

A first divider 177 divides the reception sequence of the target frame to be decoded into the reception sequence x corresponding to the transmission information bit sequence u, and the reception sequences $y_a$, $y_b$ corresponding to the transmission parity bit sequence $p_a$, $p_b$. A second divider 178 extracts and divides reception sequences $z'_{u, a}$, $z'_{p, a}$, $z'_{u, b}$, $z'_{p, b}$ corresponding to the area 14, area 15, area 16 and area 17 in FIG. 2 from a reception sequence of the frame following the target frame to be decoded. An iterative decoder 179 receives an output of the first divider 177 and an output of the second divider 178 and outputs an estimate value u' of the transmission information bits. A reception termination control means 180 controls the reception termination processing which is performed on the last or final reception frame at the end of reception.

Next, the operation of this third embodiment will be described below. In FIG. 6, at first, transmission information bit sequences u are continuously sent from an information source. The transmission information bit sequences u are saved in the first buffer 161 or the second buffer 162 for each transmission frame. A destination buffer into which the transmission information bit sequences u are to be saved is switched to an empty buffer by means of the switch 163. For instance, when a first transmission information bit sequence u corresponding to a current frame to be encoded has been saved in the first buffer 161, the switch 163 is thrown to a side b to save a second transmission information bit sequence u corresponding to the following frame so that the second transmission information bit sequence u is saved in the second buffer 162.

The switch 164 is thrown to a side a, so that a transmission information bit sequence u corresponding to a target frame to be transmitted is input to the turbo encoder 61. The transmission information bit sequence u and the transmission parity bit sequences $p_a$, $p_b$ output from the turbo encoder 61 are input to the multiplexer 165 where the transmission bit sequences are converted into a serial sequence, which is then input to the modulator 166. The modulator 166 modulates the serial sequence into a transmission signal, which is then output therefrom.

After the transmission operation with respect to the frame saved in the first buffer 161 has been completed, the switch 163 and the switch 164 are thrown to the side a and the side b, respectively, so that encoding of the following transmission frame is started and at the same time the information bit sequence u corresponding to the following transmission frame is saved in the second buffer 162.

In the known method as described before, the registers in the first and second convolutional encoders 62 and 64 of the turbo encoder 61 are initialized at the terminal end of each encoded word, i.e., each time the transmission frame is changed from one to another. To this end, tail bits for initialization are output for transmission. According to the third embodiment of the present invention, however, such initialization is carried out only at the start of transmission, but not at delimiters between transmission frames. In addition, there is no need for calculating and transmitting tail bits. The present invention is largely different from the aforementioned known art in this respect.

Specifically, when encoding of the transmission frame saved in the second buffer 162 is started, the registers in the first and second convolutional encoders 62 and 64 of the turbo encoder 61 are not initialized, but the encoding is carried out while keeping the final state of the preceding frame. After the transmission operation with respect to this transmission frame has been completed, the switch 163 and the switch 164 are thrown to the side b and the side a, respectively, so that encoding of the following transmission frame is started, and at the same time, an information bit sequence u corresponding to a further transmission frame next to the following transmission frame is saved in the second buffer 162.

When a plurality of transmission frames are to be continuously transmitted, the operation as described above is continuously carried out in an iterative manner. On the other hand, reference will be made below to the operation in cases where a transmission frame concerned is the last or final transmission frame. First of all, when a frame being intended to be encoded is the final transmission frame, the transmission termination processing control means 167 receives a transmission termination signal notifying the termination of transmission. The transmission termination processing control means 167 outputs a transmission termination control signal to the turbo encoder 61.

If a method of adding tail bits to only the final transmission frame is adopted as the transmission termination processing, the turbo encoder 61 is instructed to output a register value D of the convolutional encoders. The tail bit calculator 168 receives the register value D and calculates tail bits based thereon, which are then output to the multiplexer 166. In addition, in the case where another method is employed in which the final frame is made of a complete dummy frame, and an outcome resulting from known (predetermined) bits, which are not an information bit sequence to be transmitted, being input to the convolutional encoders is transmitted, the transmission termination processing control means 167 throws the switch 164 down to a side c, so that the dummy bits are input to the turbo encoder 61.

Moreover, in the case where there is adopted a further method of transmitting a frame comprising an information bit sequence to be transmitted until time point k=N−T' and dummy bits (i.e., known pre-determined bits which are not an information bit sequence to be transmitted) from time point K=N−T'+1 to time point k=N, control is performed such that the switch 164 is thrown to the side b from time point k=1 to time point k=N−T', and to the side c from time point k=N−T'+1 to time point k=N so as to input the dummy bits to the turbo encoder 61.

At the receiving side, the reception signal is converted into a reception sequence by means of the demodulator 170, as shown in FIG. 7. The reception sequence is saved in the first buffer 171 or the second buffer 172 or the third buffer 173 for each received frame. The destination buffer into which each reception sequence is saved is switched to an empty buffer by means of the switch 174. For instance, a reception sequence corresponding to a frame to be decoded is saved in the first buffer 171, and when such saving has been completed, the switch 174 is thrown to the side b to save a reception sequence corresponding to the following frame in the second buffer 172. Then, when saving of the reception sequence corresponding to the following frame has been completed, the switch 174 is thrown to the side c so as to save a reception sequence corresponding to a frame following the following frame.

When the reception sequence corresponding to the target frame to be decoded and the reception sequence corresponding to the following frame are saved in the buffers, a decoding operation is started. The switch 175 is thrown to the side a so that the reception sequence corresponding to the target frame to be decoded is input to the first divider 177. Then, a reception sequence x corresponding to the transmission information bit sequence u and reception sequences $y_a$, $y_b$ corresponding to the transmission parity bit sequences $p_a$, $p_b$, which are output from the first divider 177, are input to the iterative decoder Also, the switch 176 is thrown to the side b so that the reception sequence corresponding to the frame following the target frame to be decoded is input to the second divider 178. The second divider 178 extracts reception sequences $z'_{u,a}$, $z'_{p,a}$, $z'_{u,b}$, $z'_{p,b}$, corresponding to the area 14, area 15, area 16 and area 17 in FIG. 2, and inputs them to the iterative decoder 179.

The iterative decoder 179 carries out the iterative decoding, and outputs an estimate value u' of the transmission information bits.

After the above operation has been completed, a decoding operation is started with the received frame saved in the second buffer being made a new frame to be decoded, and the received frame saved in the third buffer being made a frame following the new frame to be decoded. In this case, the switch 174 is thrown to the side a so as to further save the following reception sequence. Also, the switch 175 is thrown to the side b, and the switch 176 is thrown to the side c. When reception frames are continuously received, the operation as described above is continuously carried out in this manner.

On the other hand, reference will be made below to the operation in the case where a received frame concerned is the last or final reception frame. First, when a frame being intended to be decoded is the final reception frame, the reception termination control means 180 receives a reception termination signal notifying the termination of transmission. The reception termination control means 180 outputs a reception termination control signal to the second divider 178 and the iterative decoder 179. The second divider 178 and the iterative decoder 179 operate to switch the iterative decoding operation according to a method or technique of processing transmission termination performed at the sending side.

In the case where a method of adding tail bits to only the final frame is adopted as transmission termination processing, reception sequences $z_{a,u}$, $z_{b,u}$, $z_{a,p}$, $z_{b,p}$ corresponding to the tail bits is extracted and input to the iterative decoder 179 together with the reception sequence x corresponding to the information bit sequence and the reception sequences $y_a$, $y_b$ corresponding to the parity bit sequences, and decoding processing is carried out by the iterative decoder 179. In addition, when the final frame is a dummy frame, the decoding operation is terminated without performing any processing to the final frame to be decoded. Then, in cases where a method of adding dummy bits from time point k=N−T'+1 to time point k=N is performed, iterative decoding is carried out without calculating logarithmic likelihood ratio $L(u_k)$, k=N−T'+1, N−T'+2, ..., N+1, and extrinsic information $Le(u_k)$, k=N−T'+1, N−T'+2, ..., N+1.

Although in the third embodiment, a concrete description has been made of a turbo symbol in which the number of input information bits is one and the number of output parity bits is two, there are a wide variety of parameters for the turbo symbol applicable to the third embodiment, including, for example, such ones as having two or more input information bits or three or more parity bits, ones puncturing the parity bits, and so on.

As described above, in the third embodiment, the initialization of the convolutional encoders is not carried out at delimiters between transmission frames, and therefore there is provided an effect that tail bits necessary for initialization need not be added. Accordingly, reduction in the transmission efficiency due to the tail bits can be avoided. In addition, there is no need for securing areas for tail bits in the transmission frames, so the configuration of the transmission frames can be made more straightforward. Thus, it also possible to avoid reduction in the transmission efficiency due to the tail bits. The third embodiment exerts an extremely suitable effect particularly when applied to such forms of communications as satellite communications, etc., in which transmission or reception continues for a long period of time.

Fourth Embodiment

Figure 8:
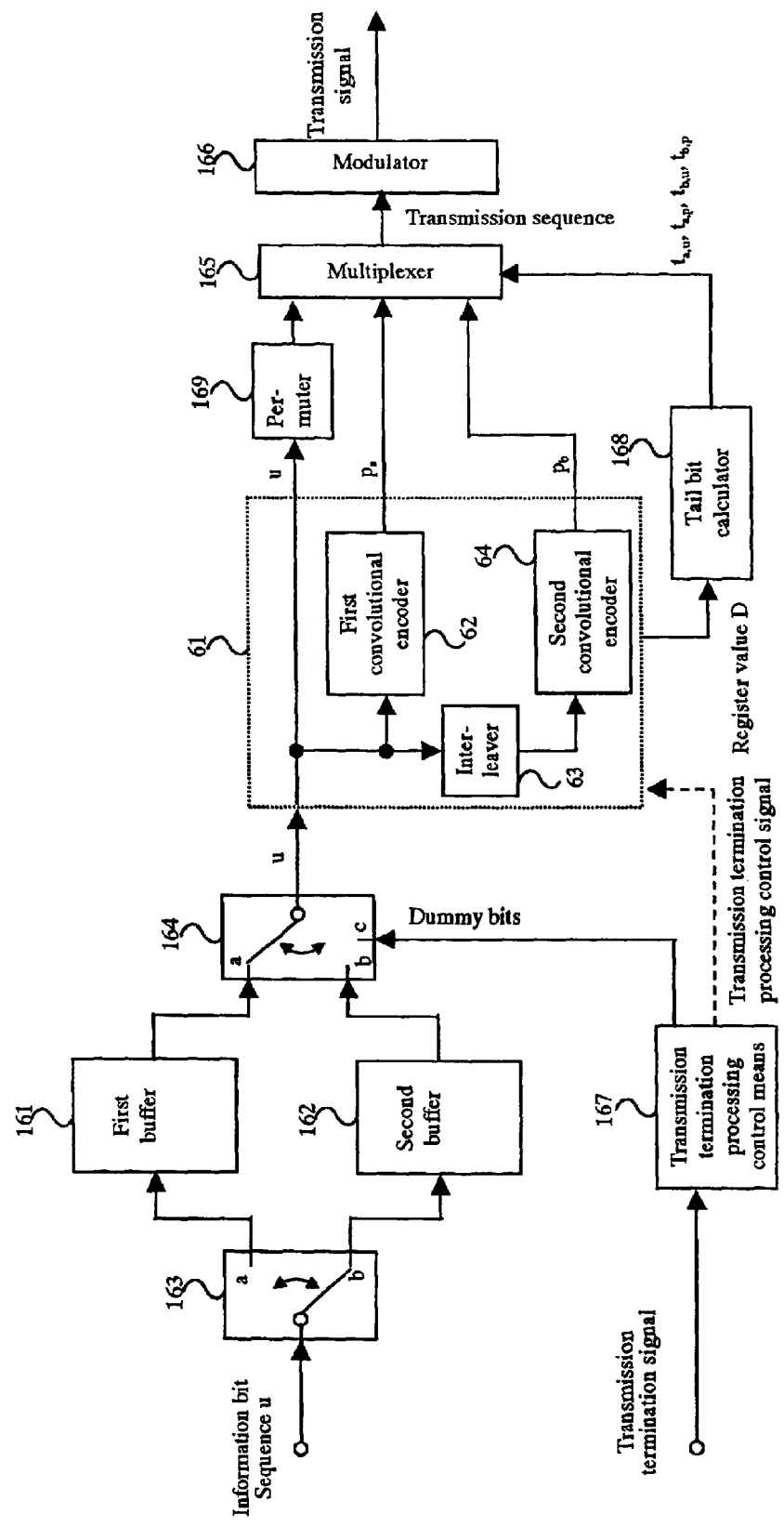
FIG. 8 is a view illustrating the configuration of an encoder according to a fourth embodiment of the present invention.

FIG. 8 shows an encoder according to a fourth embodiment of the present invention. In FIG. 8, the same or like parts of this fourth embodiment as those of the third embodiment shown in FIG. 6 are identified by the same symbols while omitting an explanation thereof. A new symbol 169 designates a permuter for permuting the order of a transmission information bit sequence u in such a manner that a certain number of bits in the sequence u, which are input to the second convolutional encoder 64 at early points in time, follow a certain number of bits in the sequence u, which are input to the first convolutional encoder 62 at early points in time.

Figure 9:
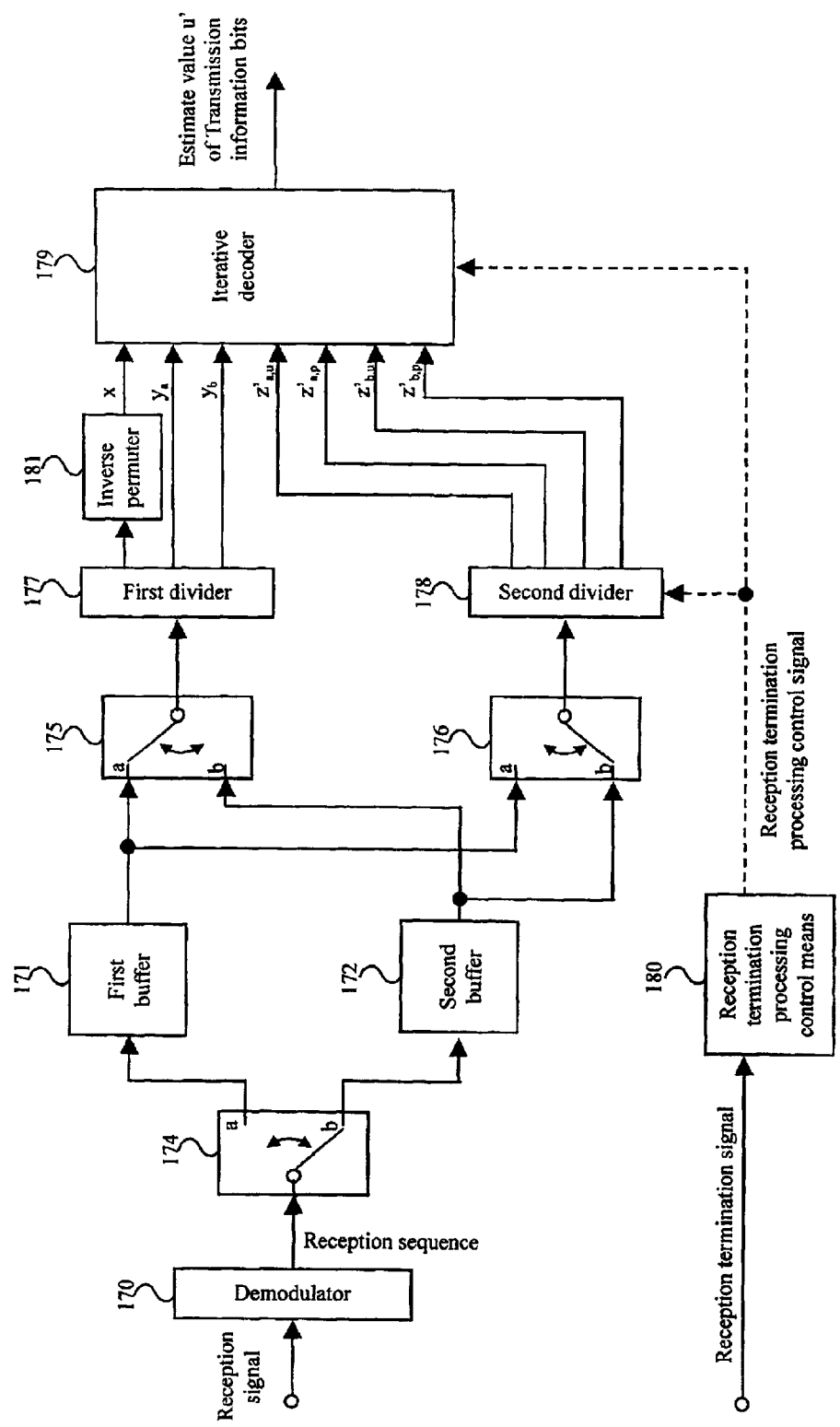
FIG. 9 is a view illustrating the configuration of a decoder according to the fourth embodiment of the present invention.
Figure 10:
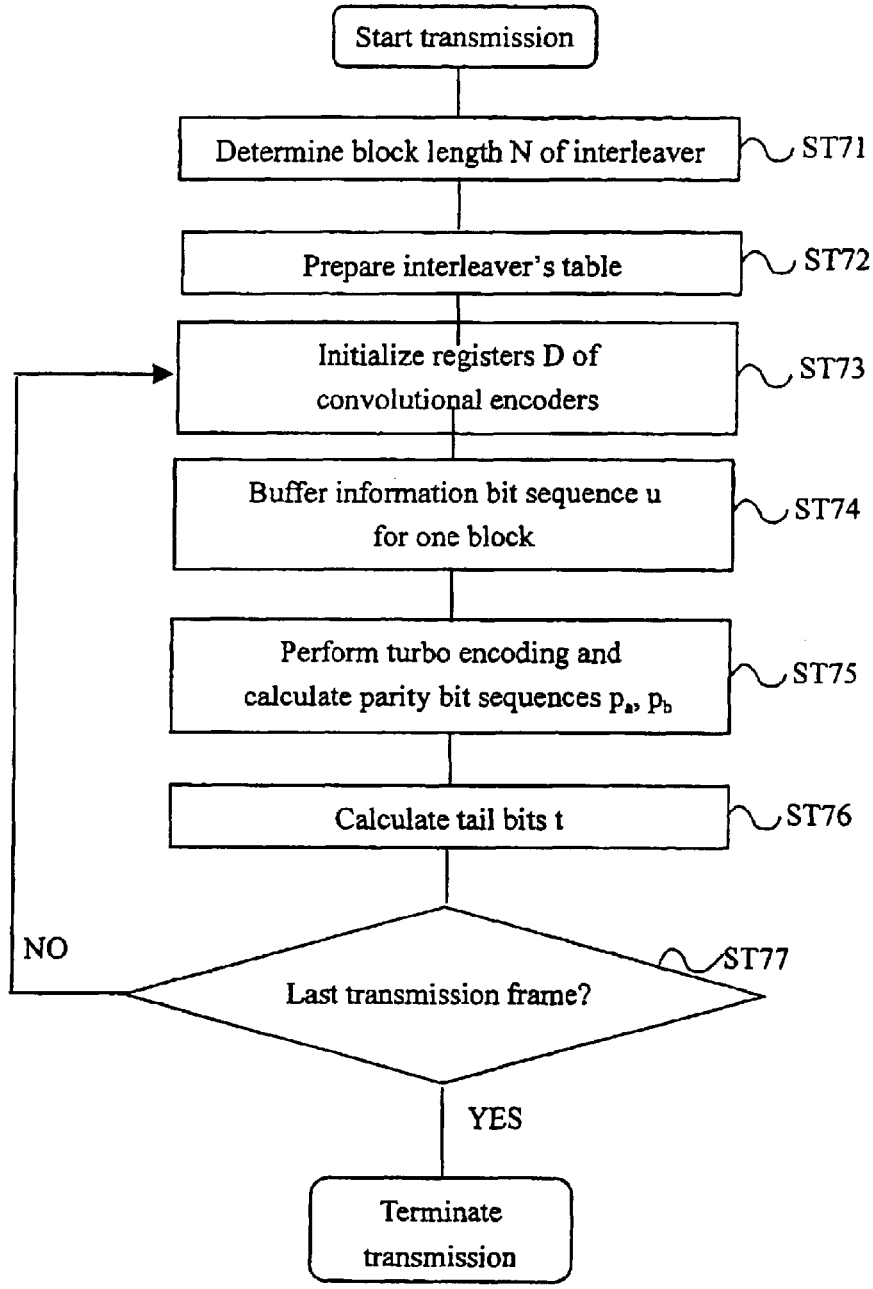
FIG. 10 is a flow chart illustrating a known turbo encoding method.

Also, FIG. 9 shows a decoder according to the fourth embodiment of the present invention. In FIG. 9, the same or like parts of this fourth embodiment as those of the third embodiment shown in FIG. 7 are identified by the same symbols while omitting an explanation thereof. A new symbol 181 designates an inverse permuter for rearranging the order of a reception sequence x to its original order.

Now, the operation of this embodiment will be described below. In the third embodiment, the information bit sequence u and the parity bit sequences $p_a$, $p_b$ encoded as shown in FIG. 2 are serially permuted in the order of ($u_k$, $p_{a,k}$, $p_{b,k}$), k=1, 2, . . . , N, and input to the modulator which then transmits an output signal. When a frame 1 is to be decoded at the receiving side, the decoding can not be done until all the reception sequences corresponding to the area 16 in a frame 2 have been received. That is, the reception sequences corresponding to the area 16 scatter over the whole frame 2, so the decoding can not be started until all the reception sequences corresponding to the frame 2 have been received.

The fourth embodiment is intended to solve this problem. After the turbo encoder 61 of FIG. 8 outputs an information bit sequence u of a target frame to be transmitted, and before the information bit sequence u and the parity bit sequences $p_a$, $p_b$ are serially permuted by the multiplexer 165, the permuter 169 retrieves information bits $u_{tb,k}$ (i.e., those bits which are input to the second convolutional encoder 64 at time point k (k=1, 2, . . . , T') corresponding to the area 16 in the information bit sequence u, and inserts them just behind the information bits $u_{ta,k}$ (i.e., those bits which are input to the first convolutional encoder 62 at time point k (k=1, 2, . . . , T') corresponding to the area 14. However, those bits among the information bits $u_{ta,k}$ which are also the information bits $u_{tb,k}$ are not retrieved and left just as they are. After such a permutation of the information bit sequence u, the information bit sequence u and the parity bit sequences $p_a$, $p_b$ are serially permuted in the order of ($u_k$, $p_{a,k}$, $p_{b,k}$), k=1, 2,. . . , N, as shown in FIG. 4.

Specifically, at the receiving side, the reception signal is converted into a reception sequence by means of the demodulator 170, as shown in FIG. 9. The reception sequence is saved in the first buffer 171 or in the second buffer 172 for each received frame. The destination buffer into which each reception sequence is saved is switched to an empty buffer by means of the switch 174. For instance, a reception sequence corresponding to a target frame to be decoded is saved in the first buffer 171, and when such saving has been completed, the switch 174 is switched over in such a manner that it is thrown to the side b to save a reception sequence corresponding to the following frame in the second buffer 172.

Then, after, among reception sequences corresponding to the following frame, those of the first 6*T' time points corresponding to the areas 141 and 142 have been saved, a decoding operation is started.

The switch 175 is thrown to the side a, so that the reception sequence corresponding to the target frame to be decoded is input to the first divider 177. Then, the first divider 177 outputs a reception sequence x corresponding to the transmission information bit sequence u and reception sequences $y_a$, $y_b$ corresponding to the transmission parity bit sequences $p_a$, $p_b$. The inverse permuter 181 rearranges the order of the reception sequence x into its original order. The reception sequence x and the reception sequences $y_a$, $y_b$ thus rearranged are input to the iterative decoder 179.

In addition, the switch 176 is thrown to the side b so that a reception sequence (only part thereof is saved) corresponding to a frame following the target frame to be decoded is input to the second divider 178. The second divider 178 extracts reception sequences $z'_{u,a}$, $z'_{p,a}$, $z'_{u,b}$, $z'_{p,b}$, corresponding to the area 14, area 15, area 16 and area 17 in FIG. 2, and inputs them to the iterative decoder 179.

The iterative decoder 179 carries out the iterative decoding, and outputs an estimate value u' of the transmission information bits.

After the decoding operation as described above has been completed, a decoding operation is started with the following frame being made a new target frame to be decoded. At first, the remainders other than those already received among the reception sequences corresponding to the new target frame to be decoded are saved in the second buffer. Then, among the reception sequences corresponding to the following frame, reception sequences of the first 6×T' time points corresponding to the areas 141 and 142 are saved in the first buffer. After such saving has been completed, a decoding operation is started with the received frame saved in the second buffer being made a new frame to be decoded, and the received frame saved in the first buffer being made a frame following the new frame to be decoded. In this case, the switch 174 is thrown to the side a, so that the remaining reception sequences of the frame following the new frame are saved. Also, the switch 175 is thrown to the side b, and the switch 176 is thrown to the side a. When reception frames are continuously received, the above operation is continuously carried out in this manner.

Thus, in the fourth embodiment which is different from the third embodiment in which iterative decoding is started after all the reception sequences of the following frame have been received, the iterative decoding is started after only parts of areas 141 and 142 of the reception sequence of the following frame have been received. The fourth embodiment is greatly different in this respect from the third embodiment. All the reception sequences $z'_{u,a}$, $z'_{p,a}$, $z'_{u,b}$, $z'_{p,b}$ corresponding to the area 14, area 15, area 16 and area 17 necessary for calculating the backward path metric $\beta(S_{j,k})$ are included in the reception sequences corresponding to the areas 141 and 142, so that iterative decoding can be carried out immediately after reception sequences of the first 6×T' time points corresponding to the areas 141 and 142 have been received and saved in the buffers.

Although in the fourth embodiment, a concrete description has been made of a turbo symbol in which the number of input information bits is one and the number of output parity bits is two, there are a wide variety of parameters for the turbo symbol applicable to the fourth embodiment, including, for example, such ones as having two or more input information bits, or three or more parity bits, ones puncturing the parity bits, and so on.

As described above, in the fourth embodiment, those bits of the information bit sequence u which are input to the second convolutional encoder 64 at time point k (k=1, 2, . . . , T') are retrieved at the sending side, and inserted immediately after those bits which have been input to the first convolutional encoder 62 at time point k (k=1, 2, . . . , T'), and thereafter the information bit sequence u and the parity bit sequences $p_a$, $p_b$ are serially permuted in the order of ($u_k$, $p_{a,k}$, $p_{b,k}$), k=1, 2, . . . , N, whereby the iterative decoding can be started at the receiving side after only part of the reception sequences of the second frame has been received, thus making it possible to reduce a delay in decoding. Moreover, since the iterative decoding can be started at the receiving side after only part of the reception sequences of the second frame has been received, it is possible to reduce the number of buffers for saving the reception sequences from three to two. The fourth embodiment achieves an extremely suitable effect particularly when applied to such forms of communications as satellite communications, etc., in which transmission or reception continues for a long period of time.

As described above, according to the present invention, the initialization of the convolutional encoders is not performed at delimiters between transmission frames, and hence tail bits necessary for initialization need not be added, thus making it possible to avoid reduction in the transmission efficiency due to the tail bits. In addition, there is no need for securing areas for tail bits in the transmission frames. Accordingly, the configuration of transmission frames can be made more straightforward, so that it becomes possible to perform error correction encoding and decoding without requiring transmission of tail bits.

While the invention has been described in terms of preferred embodiments, those skilled in the art will recognize that the invention can be practiced with modifications within the spirit and scope of the appended claims.

What is claimed is:

1. An error correction encoding method comprising:
a turbo encoding step in which a transmission information bit sequence is divided into a plurality of frames, and registers in each recursive systematic convolutional encoder are initialized before turbo encoding of a first frame, and after turbo encoding of the first frame is carried out, a second frame and following frames are continuously subjected to turbo encoding without initializing the registers in each recursive systematic convolutional encoder before the turbo encoding of the second frame and the following frames; and
a transmission termination processing step in which tail bits for initializing the registers in each recursive systematic convolutional encoder are calculated only after a final frame has been subjected to turbo encoding.

2. The error correction encoding method according to claim 1, wherein in the transmission termination processing step, known pre-determined dummy bits which are not an information bit sequence to be transmitted are inserted into a final transmission frame from a certain time point to a final time point thereof.

3. The error correction encoding method according to claim 1, wherein each of the divided frames is permuted in such a manner that a certain number of bits, among the transmission information bit sequence, which are input to a second one of the recursive systematic convolutional encoders at early time points follow a certain number of bits which are input to a first one of the recursive systematic convolutional encoders at early time points.

4. The error correction encoding method according to claim 1, further comprising:
generating frames having delimiters which are not associated with register initialization bits.

5. The error correction encoding method according to claim 1, further comprising:
combining selected information bits corresponding to a second frame with information bits corresponding to a first frame; and
permuting serially parity bits and the combined information bits wherein each bit from the combined information bits is associated with two parity bits.

6. An error correction decoding method comprising:
a buffering processing step in which a transmission information bit sequence is divided into a plurality of frames, and when a reception sequence is decoded in which noise is mixed with the transmission information bit sequence which has been subjected to turbo encoding without initializing registers in each recursive systematic convolutional encoder of a turbo encoder at a delimiter of each transmission frame, a reception sequence corresponding to a target frame to be decoded is buffered and at the same time a reception sequence corresponding to a frame following the target frame to be decoded is also buffered;
an extraction processing step in which only reception sequences needed to be input to iterative decoding means are extracted from reception sequences of the following frame;
a decoding processing step in which an estimate value of a transmission information bit sequence corresponding to the target frame to be decoded is calculated by the iterative decoding means;
a final frame determination processing step in which it is determined whether the target frame to be decoded is a final reception frame;
an operation mode switching processing step in which when the target frame to be decoded is a final reception frame, an operation procedure of the iterative decoding means is switched for the final reception frame; and
a final frame decoding processing step in which an estimate value of the transmission information bit sequence corresponding to the target frame to be decoded is calculated by the iterative decoding means corresponding to the switched mode.

7. The error correction decoding method according to claim 6, wherein in the final frame decoding processing step, a reception sequence is decoded in which noise is mixed with a transmission bit sequence into which known predetermined dummy bits, which are not an information bit sequence to be transmitted, are inserted from a certain time point to a final time point of a final transmission frame.

8. The error correction decoding method according to claim 6, wherein in the buffering processing step, when a reception sequence is decoded in which noise is mixed with a sequence whose order is permuted in such a manner that a certain number of bits, among the transmission information bit sequence, which are input to a second one of the recursive systematic convolutional encoders at early time points follow a certain number of bits which are input to a first one of the recursive systematic convolutional encoders at early time points, a reception sequence corresponding to the transmission information bit sequence is rearranged into its original order after a reception sequence corresponding to the target frame to be encoded is buffered.

9. An error correcting encoding apparatus comprising:
a finite number of buffers for saving a transmission information bit sequence for each transmission frame;
a first switch for switching between the buffers into which the transmission information bit sequence is saved;
a second switch for switching between the buffers from which the transmission information bit sequence is input to a turbo encoder;
a multiplexer for multiplexing the transmission information bit sequence and transmission parity bit sequences;
transmission termination processing control means for performing control in such a manner that only a final transmission frame is subjected to transmission termination processing; and
a tail bit calculator for calculating tail bits;
wherein transmission frames are continuously encoded without initializing registers in recursive systematic convolutional encoders of the turbo encoder at a terminal end of each transmission frame, and without calculating tail bits.

10. The error correction encoding apparatus according to claim 9, further comprising a permuter for permuting the order of the transmission information bit sequence in such a manner that a certain number of bits, among the transmission information bit sequence, which are input to a second one of the recursive systematic convolutional encoders at early time points follow a certain number of bits which are input to a first one of the recursive systematic convolutional encoders at early time points.

11. An error correction decoding apparatus comprising:
- a finite number of buffers for saving a reception sequence for each reception frame;
- a first switch for switching between the buffers into which the reception sequence is saved;
- a second switch for switching between the buffers from which a reception sequence corresponding to a target frame to be decoded is retrieved;
- a third switch for switching between the buffers from which a reception sequence corresponding to a frame following the target frame to be decoded is retrieved;
- a first divider for dividing the reception sequence corresponding to the frame to be decoded and inputting the reception sequence thus divided to an iterative decoder;
- a second divider for extracting and dividing only necessary ones from among reception sequences corresponding to a frame following the target frame to be decoded and inputting the necessary ones thus extracted and divided to the iterative decoder; and
- reception termination processing control means for performing control in such a manner that only a final reception frame is subjected to reception termination processing;

wherein the transmission information bit sequence is divided into a plurality of frames, and a reception sequence is decoded in which noise is mixed with a transmission bit sequence which has been subjected to turbo encoding without initializing registers in each recursive systematic convolutional encoder of a turbo encoder at a delimiter of each transmission frame.

12. The error correction decoding apparatus according to claim 11 further comprising an inverse permuter for rearranging a reception sequence corresponding to the transmission information bit sequence into its original order, wherein a reception sequence is decoded in which noise is mixed with a sequence whose order is permuted in such a manner that a certain number of bits, among the transmission information bit sequence, which are input to a second one of the recursive systematic convolutional encoders at early time points follow a certain number of bits which are input to a first one of the recursive systematic convolutional encoders at early time points.

* * * * *